United States Patent
Seong et al.

(10) Patent No.: US 11,086,566 B2
(45) Date of Patent: Aug. 10, 2021

(54) STORAGE DEVICE AND OPERATING METHOD THEREOF

(71) Applicant: SK hynix Inc., Gyeonggi-do (KR)

(72) Inventors: Jin Yong Seong, Seoul (KR); Jun Sang Lee, Gyeonggi-do (KR)

(73) Assignee: SK hynix Inc., Gyeonggi-do (KR)

(*) Notice: Subject to any disclaimer, the term of this patent is extended or adjusted under 35 U.S.C. 154(b) by 119 days.

(21) Appl. No.: 16/256,042

(22) Filed: Jan. 24, 2019

(65) Prior Publication Data

US 2019/0391757 A1    Dec. 26, 2019

(30) Foreign Application Priority Data

Jun. 26, 2018    (KR) .......................... 10-2018-0073657

(51) Int. Cl.
*G06F 3/06*    (2006.01)
*G11C 16/04*    (2006.01)
*G11C 16/32*    (2006.01)

(52) U.S. Cl.
CPC .......... *G06F 3/0659* (2013.01); *G06F 3/0604* (2013.01); *G06F 3/0679* (2013.01); *G11C 16/0483* (2013.01); *G11C 16/32* (2013.01)

(58) Field of Classification Search
CPC . G06F 3/0659; G06F 3/0604; G11C 16/0483; G11C 16/32
See application file for complete search history.

(56) References Cited

U.S. PATENT DOCUMENTS

| | | | | |
|---|---|---|---|---|
| 8,559,258 B1* | 10/2013 | Stephens, Jr. | .......... | G11C 16/30 365/222 |
| 2012/0032706 A1* | 2/2012 | Kim | ................ | H03K 19/00346 327/108 |
| 2012/0105124 A1* | 5/2012 | Park | ...................... | G11C 7/222 327/283 |

FOREIGN PATENT DOCUMENTS

| | | |
|---|---|---|
| KR | 1020140041207 | 4/2014 |
| KR | 1020160075094 | 6/2016 |

* cited by examiner

*Primary Examiner* — Michelle T Bechtold
(74) *Attorney, Agent, or Firm* — IP & T Group LLP

(57) ABSTRACT

In a storage device having an improved data receiving rate, the storage device includes: a plurality of memory devices each including a plurality of select signal pads; and a memory controller for providing a plurality of select signals representing a selected memory device among the plurality of memory devices through the plurality of select signal pads, wherein some select signals among the plurality of select signals include stack information indicating a number of the plurality of memory devices controlled by the memory controller.

20 Claims, 17 Drawing Sheets

| STACK | CHIP | SEL_0 | SEL_1 | SEL_2 | SEL_3 | SEL_4 | SEL_5 |
|---|---|---|---|---|---|---|---|
| ODP | CHIP1 | 0 | 0 | 0 | 0 | 0 | 1 |
|  | CHIP2 | 0 | 0 | 1 | 0 | 0 | 1 |
|  | CHIP3 | 0 | 1 | 0 | 0 | 0 | 1 |
|  | CHIP4 | 0 | 1 | 1 | 0 | 0 | 1 |
|  | CHIP5 | 1 | 0 | 0 | 0 | 0 | 1 |
|  | CHIP6 | 1 | 0 | 1 | 0 | 0 | 1 |
|  | CHIP7 | 1 | 1 | 0 | 0 | 0 | 1 |
|  | CHIP8 | 1 | 1 | 1 | 0 | 0 | 1 |
| QDP | CHIP1 | 0 | 0 | 0 | 0 | 1 | 0 |
|  | CHIP2 | 0 | 0 | 1 | 0 | 1 | 0 |
|  | CHIP3 | 0 | 1 | 0 | 0 | 1 | 0 |
|  | CHIP4 | 0 | 1 | 1 | 0 | 1 | 0 |
| DDP | CHIP1 | 0 | 0 | 0 | 1 | 0 | 0 |
|  | CHIP2 | 0 | 0 | 1 | 1 | 0 | 0 |
| SDP | CHIP1 | 0 | 0 | 0 | 0 | 0 | 0 |

FIG. 5

| STACK | CHIP | SEL_0 | SEL_1 | SEL_2 | SEL_3 | SEL_4 | SEL_5 |
|---|---|---|---|---|---|---|---|
| ODP | CHIP1 | 0 | 0 | 0 | 0 | 0 | 1 |
| | CHIP2 | 0 | 0 | 1 | 0 | 0 | 1 |
| | CHIP3 | 0 | 1 | 0 | 0 | 0 | 1 |
| | CHIP4 | 0 | 1 | 1 | 0 | 0 | 1 |
| | CHIP5 | 1 | 0 | 0 | 0 | 0 | 1 |
| | CHIP6 | 1 | 0 | 1 | 0 | 0 | 1 |
| | CHIP7 | 1 | 1 | 0 | 0 | 0 | 1 |
| | CHIP8 | 1 | 1 | 1 | 0 | 0 | 1 |
| QDP | CHIP1 | 0 | 0 | 0 | 0 | 1 | 0 |
| | CHIP2 | 0 | 0 | 1 | 0 | 1 | 0 |
| | CHIP3 | 0 | 1 | 0 | 0 | 1 | 0 |
| | CHIP4 | 0 | 1 | 1 | 0 | 1 | 0 |
| DDP | CHIP1 | 0 | 0 | 0 | 1 | 0 | 0 |
| | CHIP2 | 0 | 0 | 1 | 1 | 0 | 0 |
| SDP | CHIP1 | 0 | 0 | 0 | 0 | 0 | 0 |

FIG. 9

| STACK | TUNE DELAY [7:0] | | | | | | | |
|---|---|---|---|---|---|---|---|---|
| | [0] | [1] | [2] | [3] | [4] | [5] | [6] | [7] |
| ODP | 0 | 0 | 0 | 0 | 0 | 0 | 0 | 1 |
| QDP | 0 | 0 | 0 | 0 | 1 | 1 | 1 | 1 |
| DDP | 0 | 0 | 1 | 1 | 1 | 1 | 1 | 1 |
| SDP | 0 | 1 | 1 | 1 | 1 | 1 | 1 | 1 |

STORAGE DEVICE AND OPERATING METHOD THEREOF

CROSS-REFERENCE TO RELATED APPLICATION

The present application claims priority under 35 U.S.C. § 119(a) to Korean patent application number 10-2018-0073657, filed on Jun. 26, 2018, which is incorporated herein by reference in its entirety.

BACKGROUND

1. Field of Invention

The present disclosure generally relates to an electronic device, and more particularly, to a storage device and an operating method thereof.

2. Description of Related Art

A storage device stores data under the control of a host device such as a computer, a smart phone or a smart pad. Examples of a storage device include a Hard Disk Drive (HDD), and a Solid State Drive (SSD) or a memory card.

The storage device may include a memory device for storing data and a memory controller for controlling the memory device. The memory device may be a volatile memory device or a nonvolatile memory device. Examples of a nonvolatile memory device include a Read Only Memory (ROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like.

SUMMARY

Embodiments provide a storage device having an improved data receiving rate and an operating method thereof.

In accordance with an aspect of the present disclosure, there is provided a storage device including: a plurality of memory devices each including a plurality of select signal pads; and a memory controller configured to provide a plurality of select signals representing a selected memory device among the plurality of memory devices through the plurality of select signal pads, wherein some select signals among the plurality of select signals include stack information indicating a number of the plurality of memory devices controlled by the memory controller.

In accordance with another aspect of the present disclosure, there is provided a memory device including: a plurality of select signal pads configured to receive a plurality of select signal respectively; a plurality of data signal pads configured to receive a data signal; a delay tuning circuit in communication with the plurality of select signal pads and the plurality of data signal pads, the delaying tuning circuit configured to determine an amount of delay to be applied to the data signal according to some select signals among the plurality of select signals; and a data storage configured to generate a tuned data signal by applying the determined amount of delay to the data signal, and to store the tuned data signal according to a reference clock.

In accordance with still another aspect of the present disclosure, there is provided a method for operating a memory device including a plurality of select signal pads and a plurality of data signal pads, the method including: receiving a delay tuning command from a memory controller; acquiring stack information from some select signals among a plurality of select signals input through the plurality of select signal pads, in response to the delay tuning command; and generating a delay tuning signal for determining an amount of delay, to be applied to a data signal input through the plurality of data signal pads, based on the stack information In accordance with still another aspect of the present disclosure, there is provided a memory device including a memory cell array a peripheral circuit configured to receive a data signal from a controller coupled to the memory device a delay tuning circuit configured to provide information representing a number of memory devices coupled to the controller and a data tuner configured to delay the data signal by a determined amount according to the information such that the determined amount is inversely related to the number, wherein the peripheral circuit is further configured to store the delayed data signal in the memory cell array.

BRIEF DESCRIPTION OF THE DRAWINGS

Various embodiments will now be described more fully hereinafter with reference to the accompanying drawings; however, elements and features of the present invention may be configured or arranged differently than disclosed herein. Thus, the present invention is not limited to the embodiments set forth herein. Rather, these embodiments are provided so that this disclosure is thorough and complete and fully conveys the scope of the embodiments to those skilled in the art. It is further noted that, throughout the specification, reference to "an embodiment," "another embodiment," or the like is not necessarily to only one embodiment, and different references to any such phrase is not necessarily to the same embodiment(s).

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 5 is a diagram illustrating select signals input to a plurality of select signal pads described with reference to FIG. 4.

FIG. 9 is a diagram illustrating a delay tuning signal generated by the delay tuning circuit of FIG. 8 in accordance with an embodiment of the present disclosure.

DETAILED DESCRIPTION

Figure 1:
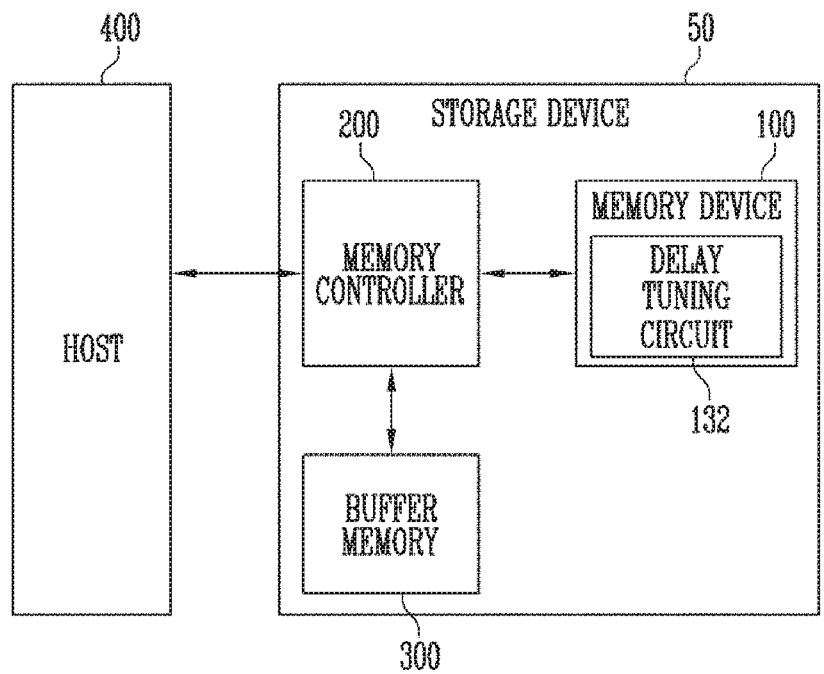
FIG. 1 is a block diagram illustrating an exemplary storage device.

The specific structural or functional description disclosed herein is for the purpose of describing embodiments in accordance with embodiments of the present disclosure. The embodiments can be modified and implemented in various forms. Thus, the present invention is not limited to the embodiments set forth herein.

While details of various embodiments are illustrated and described, the present invention is not limited to these specific details; rather, the present invention includes all changes, equivalents, or substitutes that do not depart from the spirit and technical scope of the present disclosure.

While terms such as "first" and "second" may be used to identify various components, such components are not limited by these identifiers, which are used only to distinguish one component from another that otherwise have the same or similar names. For example, a first component in one instance may be referred to as a second component in another instance without departing from the scope of rights of the present disclosure.

It will be understood that when an element is referred to as being "connected" or "coupled" to another element, it can be directly connected or coupled to the other element or one or more intervening elements may also be present. In contrast, when an element is referred to as being "directly connected" or "directly coupled" to another element, no intervening elements are present. Moreover, unless the context indicates otherwise, a direct or indirect connection or coupling may be wired or wireless. Other expressions describing relationships between components such as "~ between," "immediately ~ between" or "adjacent to ~" and "directly adjacent to ~" may be construed similarly.

The terms used in the present application are merely used to describe particular embodiments, and are not intended to limit the present disclosure. Singular forms in the present disclosure are intended to include the plural forms and vice versa, unless the context clearly indicates otherwise. It will be further understood that terms such as "including" or "having," and other open-ended expressions are intended to indicate the presence or addition of stated features, numbers, operations, actions, components, parts, or combinations thereof but are not intended to preclude the presence or addition of one or more other features, numbers, operations, actions, components, parts, or combinations thereof.

So far as not being differently defined, all terms used herein including technical or scientific terms have meanings commonly understood by those skilled in the art to which the present disclosure pertains. The terms having definitions as defined in the dictionary should be understood such that they have meanings consistent with the context of the related technique. So far as not being clearly defined in this application, terms should not be understood in an ideally or excessively formal way.

In describing embodiments, description of techniques that are well known to the art to which the present disclosure pertains and not directly related to the present disclosure is omitted so as not to unnecessarily obscure the present invention.

In this specification, the term "memory device" may be used along with the term "die" or "memory chip," and be have the same meaning as the term "die" or "memory chip."

Various embodiments of the present disclosure will be described in detail with reference to the accompanying drawings to enable those skilled in the art to be able to readily implement the present invention.

FIG. 1 is a block diagram illustrating a storage device.

Referring to FIG. 1, the storage device 50 may include a memory device 100, a memory controller 200, and a buffer memory 300.

The storage device 50 may store data under the control of a host 400, such as a mobile phone, a smart phone, an MP3 player, a laptop computer, a desktop computer, a game console, a TV, a tablet PC or an in-vehicle infotainment.

The storage device 50 may be configured as any one of various types of storage devices according to a host interface that is a communication scheme with the host 400. For example, the storage device 50 may be implemented with any one of various types of storage devices such as a multi-media card of a Solid State Drive (SSD), a Multi-Media Card (MMC), an embedded, Multi-Media Card (eMMC), a Reduced Size, Multi-Media Card (RS-MMC), and a micro-Multi-Media Card (micro-MMC) type, a Secure Digital (SD) card of a Secure Digital (SD), a mini-Secure Digital (mini-SD) and a micro-Secure Digital (micro-SD) type, an Universal Storage Bus (USB) storage device, a Universal Flash Storage (UFS) device, a storage device of a Personal Computer Memory Card International Association (PCMCIA) card type, a storage device of a Peripheral Component Interconnection (PCI) card type, a storage device of a PCI-Express (PCI-E) card type, a Compact Flash (CF) card, a smart media card, and a memory stick.

The storage device 50 may be configured as any one of various kinds of package types. For example, the storage device 50 may be manufactured as any one of various kinds of package types such as a Package-On-Package (POP), a System-In-Package (SIP), a System-On-Chip (SOC), a Multi-Chip Package (MCP), a Chip-On-Board (COB), a Wafer-level Fabricated Package (WFP), and a Wafer-level Stack Package (WSP).

The memory device 100 may store data. The memory device 100 operates under the control of the memory controller 200. The memory device 100 may include a memory cell array including a plurality of memory cells for storing data. The memory cell array may include a plurality of memory blocks. Each memory block may include a plurality of memory cells. One memory block may include a plurality of pages.

In some embodiments, the page may be a unit for storing data or reading data stored in the memory device 100. The memory block may be a unit for erasing data.

In an embodiment, the memory device 100 may be a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (SU-RAM), or the like. In this specification, for convenience of description, an example in which the memory device 100 is a NAND flash memory is assumed and described.

In an embodiment, the memory device 100 may be implemented in a three-dimensional array structure. The present disclosure may be applied to not only a flash memory device in which a charge storage layer is configured with a Floating Gate (FG) but also a Charge Trap Flash (CTF) in which a charge storage layer is configured with an insulating layer.

In an embodiment, each of the memory cells included in the memory device 100 may be configured as a Single Level Cell (SLC) for storing one data bit. Also, each of the memory cells included in the memory device 100 may be configured as a Multi-Level Cell (MLC) for storing two data bits, a Triple Level Cell (TLC) for storing three data bits, or a Quad Level Cell (QLC) for storing four data bits.

The memory device 100 is configured to receive a command and an address from the memory controller 200 and access an area selected by the address in the memory cell array. That is, the memory device 100 may perform an operation corresponding to the command on the area selected by the address. For example, the memory device 100 may perform a write (program) operation, a read operation, and an erase operation. In the program operation, the memory device 100 may program data in the area selected by the address. In the read operation, the memory device 100 may read data from the area selected by the address. In the erase operation, the memory device 100 may erase data stored in the area selected by the address.

In a program operation, the memory device 100 may receive data, which is to be programmed therein, from the memory controller 200 in response to a timing signal.

The memory device 100 may temporarily store the received data in a buffer included therein. The memory device 100 may perform a program operation of storing the temporarily stored data in memory cells.

In various embodiments, the storage device 50 may include a plurality of memory devices 100. In this arrangement, the memory controller 200 may control the plurality of memory devices 100. The memory devices 100 may be commonly coupled to one channel to communicate with the memory controller 200.

The storage device 50 may include a memory die package, a type of which is determined according to a number of memory devices 100 in the storage device 50. For example, the storage device 50 may include any of a Single Die Package (SDP) including one memory device 100, a Double Die Package (DDP) in which two memory devices 100 are stacked, a Quad Die Package (QDP) in which four memory devices 100 are stacked, and an Octa Die Package (ODP) in which eight memory devices 100 are stacked.

When the number of memory devices 100 in the storage device 50 increases, the number of memory devices 100 commonly coupled to the memory controller 200 through a single channel may increase. As the number of memory devices 100 commonly coupled to the memory controller 200 through a single channel increases, a capacitive load on the channel may increase due to the number of capacitances of input drivers (not shown) of the memory devices 100, and therefore, physical loading may increase in terms of data communication. Accordingly, signals transferred to each memory device 100 may be delayed.

In accordance with an embodiment of the present disclosure, the memory device 100 may further include a delay tuning circuit 132 for determining an amount of delay to be applied to a data signal provided from the memory controller 200 when storing the data signal. For example, the memory device 100 may generate a delay tuning signal for determining an amount of delay to be applied to a data signal provided thereto under the control of the memory controller 200.

Specifically, when a delay tuning command is received from the memory controller 200, the delay tuning circuit 132 may generate a delay tuning signal for determining an amount of delay to be applied to the data signal provided to the memory device 100 according to a number of memory devices 100 included in the memory die package of the storage device 50.

In an embodiment, a delay tuning command may be provided by an external test device in a test process of the memory device 100. The delay tuning command provided from the external test device in the test process and the delay tuning command provided from the memory controller 200 in an operation of the storage device 50 may instruct different amounts of delay to be applied to the data signal provided to the memory device 100.

The memory device 100 may apply the amount of delay, which is determined in response to the delay tuning signal, to the provided data signal and may store the delay-applied data signal therein.

The delay tuning circuit 132 and the memory device 100 that applies an amount of delay in response to the delay tuning signal will be described in more detail with reference to FIGS. 2 to 10.

The memory controller 200 may control overall operations of the storage device 50.

When power is applied to the storage device 50, the memory controller 200 may execute firmware (FW). When the memory device 100 is a flash memory device, the memory controller 200 may execute FW such as a Flash Translation Layer (FTL) for controlling communication between the host 400 and the memory device 100.

In various embodiments, the memory controller 200 may provide the memory device 100 with a reset command and then a delay tuning command for tuning an amount of delay.

In an embodiment, the memory controller 200 may receive data and a Logical Block Address (LBA) from the host 400, and translate the LBA into a Physical Block Address (PBA) representing addresses of memory cells included in the memory device 100, in which data is stored. Also, the memory controller 200 may store, in the buffer memory, logical-physical address mapping information that establishes a mapping relationship between the LBA and the PBA.

The memory controller 200 may control the memory device 100 to perform a program operation, a read operation, an erase operation, or the like in response to a request from the host 400. In the program operation, the memory controller 200 may provide a program command, a PBA, and data to the memory device 100. In the read operation, the memory controller 200 may provide a read command and a PBA to the memory device 100. In the erase operation, the memory controller 200 may provide an erase command and a PBA to the memory device 100.

In an embodiment, the memory controller 200 may autonomously generate a program command, an address, and data without any request from the host 400, and transmit the program command, the address, and the data to the memory device 100. For example, the memory controller 200 may provide the command, the address, and the data to the memory device 100 to perform background operations such as a program operation for wear leveling and a program operation for garbage collection.

In an embodiment, the memory controller 200 may control data exchange between the host 400 and the buffer memory 300. Alternatively, the memory controller 200 may temporarily store system data for controlling the memory device 100 in the buffer memory 300. For example, the memory controller 200 may temporarily store data input from the host 400 in the buffer memory 300, and then transmit the data temporarily stored in the buffer memory 300 to the memory device 100.

In various embodiments, the buffer memory 300 may be used as a working memory or cache memory of the memory controller 200. The buffer memory 300 may store codes or commands, which are executed by the memory controller 200. Alternatively, the buffer memory 300 may store data processed by the memory controller 200.

In an embodiment, the buffer memory 300 may be implemented with a Dynamic Random Access Memory (DRAM) such as a Double Data Rate Synchronous DRAM (DDR SDRAM), a Low Power Double Data Rate 4 (LPDDR4) SDRAM, a Graphics Double Data Rate (GDDR) SDRAM, a Low Power DDR (LPDDR) or a Rambus Dynamic Random Access Memory (RDRAM), or a Static Random Access Memory (SRAM).

In various embodiments, the storage device 50 may not include the buffer memory 300, which may be provided separately or its functions distributed among other components in the storage device 50. Volatile memory devices provided external to the storage device 50 may serve as the buffer memory 300.

In an embodiment, the memory controller 200 may control at least two memory devices 100. The memory controller 200 may control the memory devices according to an interleaving scheme so as to improve operational performance.

The host 400 may communicate with the storage device 50, using at least one of various communication protocols, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a nonvolatile memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

Figure 2:
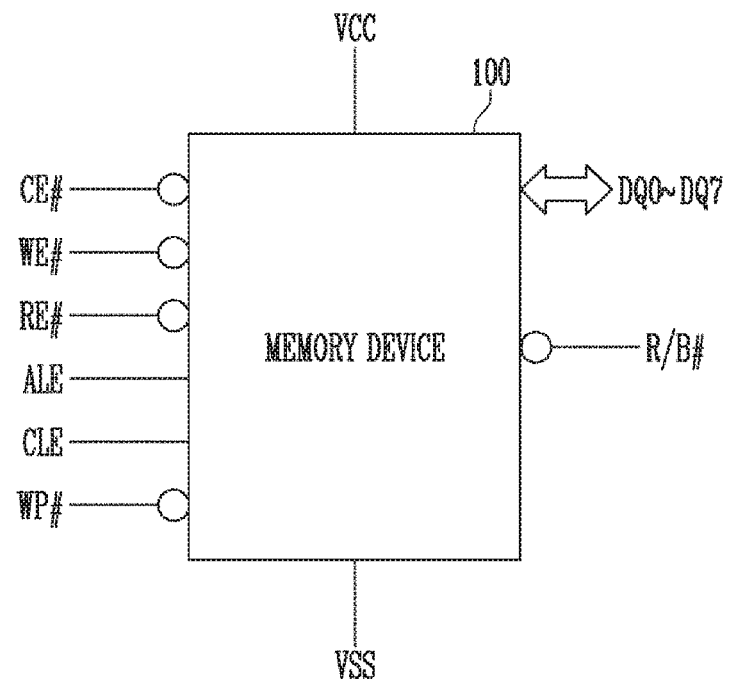
FIG. 2 is a diagram illustrating signals input to and output from a memory device of FIG. 1.

FIG. 2 is a diagram illustrating signals input to and output from the memory device of FIG. 1.

Referring to FIG. 2, the memory device 100 communicates with an external controller through data input/output lines DQ0 to DQ7 and control signal lines including a chip enable line CE#, a write enable line WE#, a read enable line RE#, an address latch enable line ALE, a command latch enable line CLE, a write prevention line WP#, and a ready/busy line R/B#.

The memory device 100 may receive a chip enable signal from the external controller through the chip enable line CE#. The memory device 100 may receive a write enable signal from the external controller through the write enable line WE#. The memory device may receive a read enable signal from the external controller through the read enable line RE#. The memory device 100 may receive an address latch enable signal from the external controller through the address latch enable line ALE. The memory device 100 may receive a command latch enable signal from the external controller through the command latch enable line CLE. The memory device 100 may receive a write prevention signal from the external controller through the write prevention line WP#.

In an embodiment, the memory device 100 may output, to the external controller, a read busy signal for outputting whether the memory device 100 is in a ready state or busy state, through the ready/busy line R/B#.

The chip enable signal may be a control signal for selecting the memory device 100. When the chip enable signal is in a 'high' state, and the memory device 100 corresponds to the 'ready' state, the memory device 100 may enter into a low power standby state.

The write enable signal may be a control signal for controlling a command, an address, and input data, which are input to the memory device, to be stored in a latch.

The read enable signal may be a control signal for enabling the output of serial data.

The address latch enable signal may be one of control signals used by a host to represent which one of a command, an address, and data the type of a signal input to the input/output lines DQ0 to DQ7 is.

The command latch enable signal may be one of control signals used by the host to represent which one of the command, the address, and the data the type of a signal input to the input/output lines DQ0 to DQ7 is.

For example, when the command latch enable signal is activated (e.g., logic high), the address latch enable signal is inactivated (e.g., logic low), and the write enable signal is activated (e.g., logic low) and then inactivated (e.g., logic high), the memory device may identify that the signal input through the input/output lines DQ0 to DQ7 is a command.

For example, when the command latch enable signal is inactivated (e.g., logic low), the address latch enable signal is activated (e.g., logic high), and the write enable signal is activated (e.g., logic low) and then inactivated (e.g., logic high), the memory device may identify that the signal input through the input/output lines DQ0 to DQ7 is an address.

The write prevention signal may be a control signal for inactivating the memory device 100 that performs a program operation and an erase operation.

The ready/busy signal may be a signal for identifying a state of the memory device 100. The read/busy signal in a low state represents that the memory device 100 is performing at least one operation. The read/busy signal in a high state represents that the memory device 100 does not perform any operation.

In an embodiment, the storage device 50 described with reference to FIG. 1 may include a plurality of memory devices 100. Input/output lines DQ0 to DQ7 of the plurality of memory devices 100 controlled by the memory controller 200 may be commonly coupled.

Figure 3:
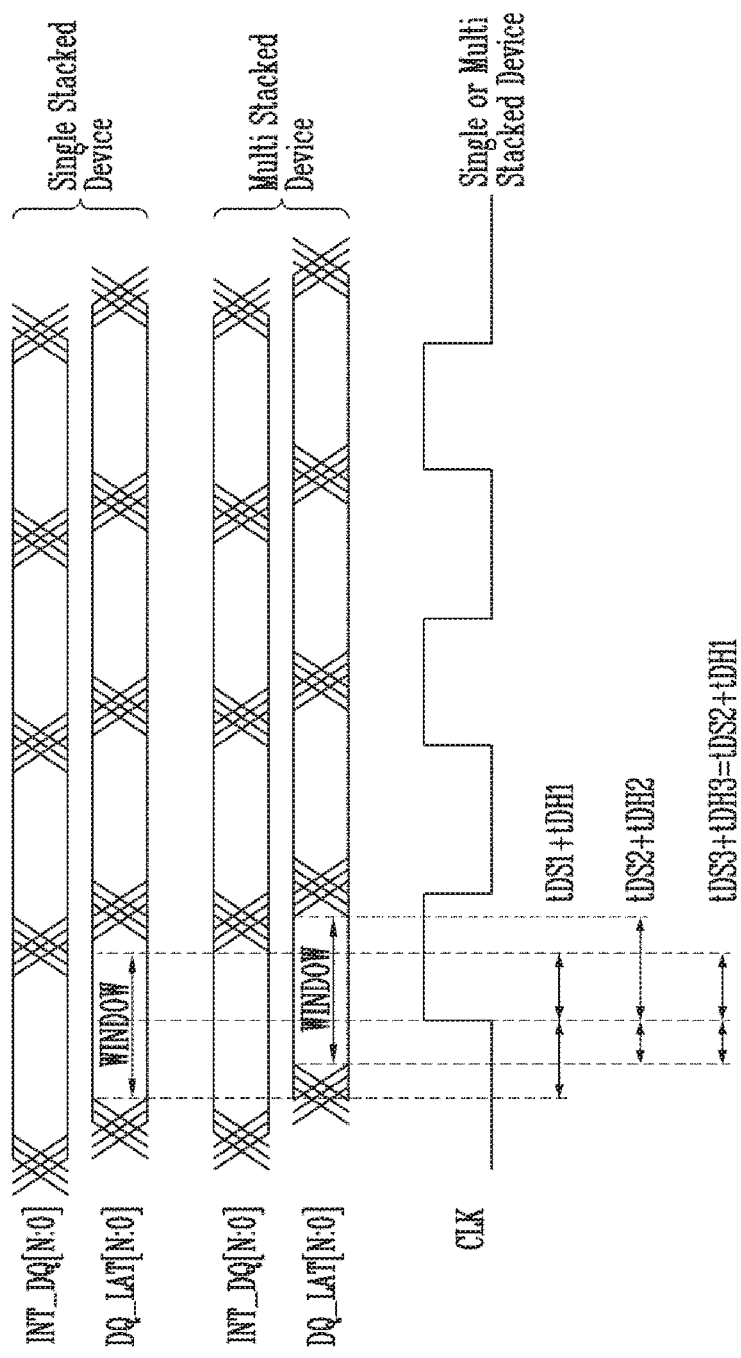
FIG. 3 is a diagram illustrating a phenomenon that occurs when the number of memory devices in a storage device increases.

FIG. 3 is a diagram illustrating a phenomenon occurring when the number of memory devices included in the storage device of FIG. 1 increases.

Referring to FIG. 3, the memory device may receive a data signal through input/output lines DQ0 to DQN. Each of the input/output lines DQ0 to DQN may be coupled to an input/output pad of the memory device.

In FIG. 3, INT_DQ[N:0] may be an internal data signal INT_DQ[N:0] that is a data signal provided from the memory controller to the memory device through an input driver of the memory device. The memory device may generate a delay data signal DQ_LAT[N:0] obtained by applying an amount of delay, which may be preset, to the internal data signal INT_DQ[N:0]. The delay data signal DQ_LAT[N:0] may be a signal obtained by applying an amount of delay to the internal data signal INT_DQ[N:0] such that the delay data signal DQ_LAT[N:0] can be stored at a rising edge of a clock signal CLK.

The delay data signal DQ_LAT[N:0] may be stored in a latch in synchronization with the clock signal CLK of the memory device. In an embodiment, the latch may be included in a page buffer circuit.

Specifically, the delay data signal DQ_LAT[N:0] may be stored in the latch in synchronization with a rising edge of the clock signal CLK. That is, data represented in the delay data signal DQ_LAT[N:0] may be stored in the latch at the rising edge of the clock signal CLK.

Referring to FIG. 3, data of the delay data signal DQ_LAT[N:0] is stored in the latch during a data window, and the memory device can more stably store the data of the delay data signal DQ_LAT[N:0] as the data window becomes wider.

A conventional memory device determines an amount of delay to be applied to the internal data signal INT_DQ[N:0], based on a single stacked device in which one memory device is included in the storage device. In the single stacked device, a data setup time tDS1 representing the duration in which the clock signal is in a low state and a data hold time tDH1 representing the duration in which the clock signal is in a high state are set to the same duration within the data window.

However, when the storage device is a multi-stacked device including a plurality of memory devices, capacitances of input drivers increase when the number of memory devices included in the storage device increases. This is because input/output lines DQ0 to DQ7 of the memory devices are commonly coupled. Therefore, an internal data signal INT_DQ[N:0] input to each of the memory devices may be further delayed as compared with the single stacked device. When a single amount of delay to be applied to the internal data signal INT_DQ[N:0] is determined based on the single stacked device in the case of the multi-stacked device, a delay data signal DQ_LAT[N:0] of the multi-stacked device may include a greater amount of delay than that applied to a delay data signal DQ_LAT[N:0] of the single stacked device.

When assuming that the clock signal CLK is tuned to a fixed timing, the delay data signal DQ_LAT[N:0] of the multi-stacked device may have a data setup time tDS2 of a shorter duration than the data setup time tDS1 of the delay data signal DQ_LAT[N:0] of the single stacked device. Also, the delay data signal DQ_LAT[N:0] of the multi-stacked device may have a data hold time tDH2 of a longer duration than the data hold time tDH1 of the delay data signal DQ_LAT[N:0] of the single stacked device.

A data setup time tDS3 and a data hold time tDH3, which satisfy both of the data setup time tDS1 and data hold time tDH1 of the single stacked device and the data setup time tDS2 and data hold time tDH2 of the multi-stacked device, may be shortened when the number of memory devices included in the multi-stacked device increases.

When an amount of delay to be applied to the internal data signal INT_DQ[N:0] is set based on the single stacked device in the case of the multi-stacked device, it is difficult to secure an appropriate data setup time and an appropriate data hold time in the multi-stacked device.

In addition, when a single amount of delay is applied to the internal data signal INT_DQ[N:0] regardless of the number of memory devices included in the storage device, it may be difficult to secure an appropriate data setup time and an appropriate data hold time.

In accordance with embodiments of the present disclosure, there are provided a storage device for applying different amounts of delay to an input internal data signal INT_DQ[N:0] according to a number of memory devices included in the storage device so as to secure a data setup time tDS and a data hold time tDH, and an operating method thereof.

Figure 4:
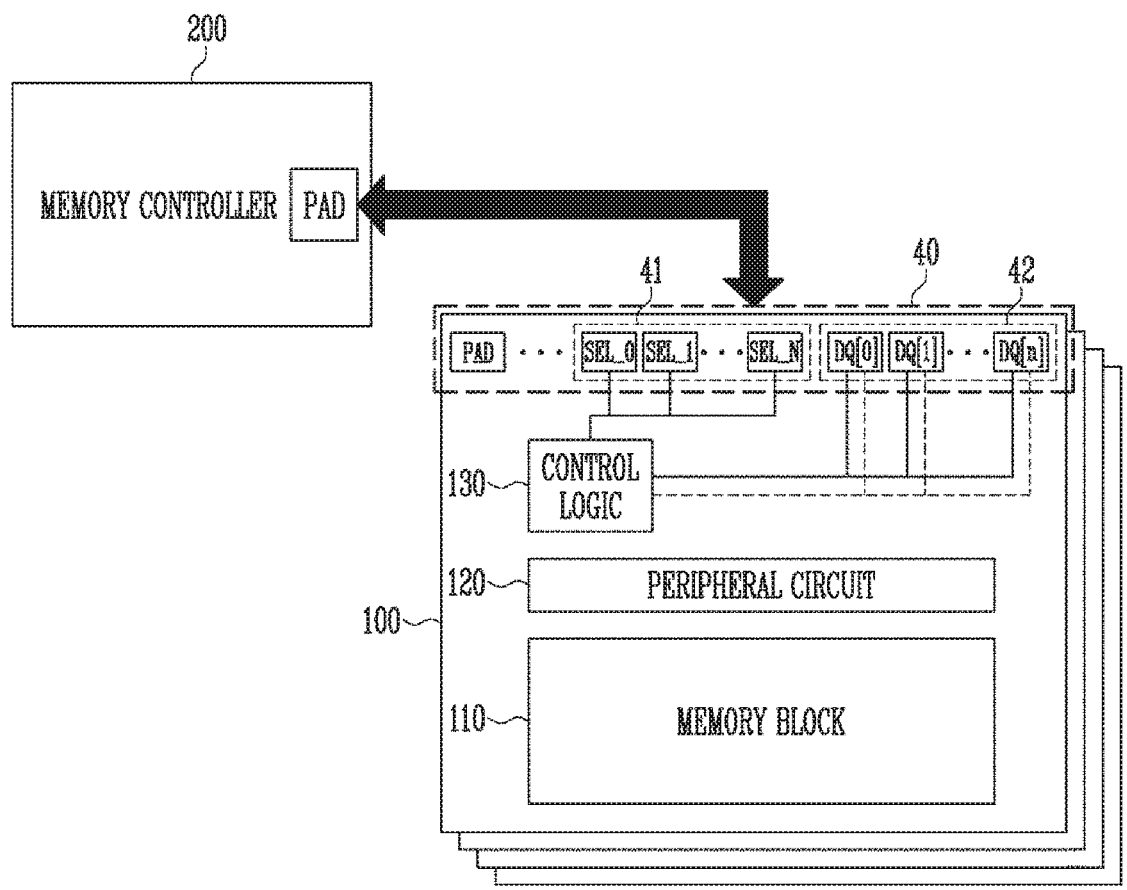
FIG. 4 is a diagram illustrating a coupling relationship between a memory controller and the memory device.

FIG. 4 is a diagram illustrating a coupling relationship between the memory controller 200 and the memory device 100.

Referring to FIG. 4, the memory device 100 may include a plurality of pads 40. The plurality of pads 40 of the memory device 100 may be coupled to a pad of the memory controller 200. The plurality of pads 40 may receive signals for communicating with the memory controller 200.

The memory device 100 may include a select signal pad assembly 41 and a data signal pad assembly 42.

The select signal pad assembly 41 may include a plurality of select signal pads SEL_0 to SEL_N. The memory controller 200 may select a corresponding memory device 100 by providing a select signal to the plurality of select signal pads SEL_0 to SEL_N. Select signals input through the plurality of select signal pads SEL_0 to SEL_N may be provided to a control logic 130 of the memory device 100. The select signals input through the plurality of select signal pads SEL_0 to SEL_N may be used to identify the respective memory devices 100.

In an embodiment, the select signals may be chip enable signals input to the chip enable line CE# described with reference to FIG. 2.

The data signal pad assembly 42 may include a plurality of data signal pads DQ[0] to DQ[n]. The memory device 100 may receive a data signal from the memory controller 200 through the plurality of data signal pads DQ[0] to DQ[n]. The memory device 100 may simultaneously receive data of n+1 bits through the plurality of data signal pads DQ[0] to DQ[n]. In an embodiment, the number of data signal pads DQ[0] to DQ[n] may be eight. However, this is merely an example; the number of data signal pads DQ[0] to DQ[n] in the memory device 100 is not limited to eight.

FIG. 5 is a diagram illustrating the select signals input the plurality of select signal pads SEL_0 to SEL_N described with reference to FIG. 4.

In FIG. 5, an example in which the number of select signal pads is six is illustrated. Zeroth to fifth select signals SEL_0 to SEL_5 may be respectively input through the six select signal pads.

In an embodiment of the present disclosure, some select signals among the zeroth to fifth select signals SEL_0 to SEL_5 may be used to identify memory devices, and the other select signals may be used to represent a number of memory devices included in the storage device. Thus, through the select signals, the number of memory devices in the storage device can be detected, and accordingly, an amount of delay to be applied to an internal data signal can be determined.

Specifically, referring to FIG. 5, the storage device may include any one package among a Single Die Package (SDP) including one memory chip, a Double Die Package (DDP) in which two memory chips are stacked, a Quad Die Package (QDP) in which four memory chips are stacked, and an Octa Die Package (ODP) in which eight memory chips are stacked.

The zeroth to second select signals SEL_0 to SEL_2 among the zeroth to fifth select signals SEL_0 to SEL_5 may be select signals for identifying memory chips. For example, when memory chips included in the storage device constitute an ODP, memory chip 1 CHIP1 may be selected according to the zeroth to second select signals SEL_0 to SEL_2 having a value of "000." Memory chip 2 CHIP2 may be selected according to the zeroth to second select signals SEL_0 to SEL_2 having a value of "001." Memory chip 3 CHIP3 may be selected according to the zeroth to second select signals SEL_0 to SEL_2 having a value of "010." Memory chip 4 CHIP4 may be selected according to the zeroth to second select signals SEL_0 to SEL_2 having a value of "011." Memory chip 5 CHIP5 may be selected according to the zeroth to second select signals SEL_0 to SEL_2 having a value of "100." Memory chip 6 CHIP6 may be selected according to the zeroth to second select signals SEL_0 to SEL_2 having a value of "101." Memory chip 7 CHIP7 may be selected according to the zeroth to second select signals SEL_0 to SEL_2 having a value of "110." Memory chip 8 CHIP8 may be selected according to the zeroth to second select signals SEL_0 to SEL_2 having a value of "111."

In an embodiment, when memory chips included in the storage device constitute a QDP, memory chip 1 CHIP1 may be selected according to the zeroth to second select signals SEL_0 to SEL_2 having a value of "000." Memory chip 2 CHIP2 may be selected according to the zeroth to second select signals SEL_0 to SEL_2 having a value of "001." Memory chip 3 CHIP3 may be selected according to the zeroth to second select signals SEL_0 to SEL_2 having a value of "010." Memory chip 4 CHIP4 may be selected according to the zeroth to second select signals SEL_0 to SEL_2 having a value of "011."

In an embodiment, when memory chips included in the storage device constitute a DDP, memory chip 1 CHIP1 may be selected according to the zeroth to second select signals SEL_0 to SEL_2 having a value of "000." Memory chip 2 CHIP2 may be selected according to the zeroth to second select signals SEL_0 to SEL_2 having a value of "001."

In an embodiment, in the case of an SDP in which the number of memory chips included in the storage device is one, memory chip 1 CHIP1 may be selected according to the zeroth to second select signals SEL_0 to SEL_2 having a value of "000."

Thus, even in the case of an ODP in which the number of memory chips is largest, the select signals required to identify eight memory chips are represented by 3 bits, one for each signal, which is sufficient. The storage device in accordance with embodiments of the present disclosure may provide the memory device with a stack information that is information on a number of memory devices included in the storage device, using the third to fifth select signals SEL_3 to SEL_5.

Stack information that the third to fifth select signals SEL_3 to SEL_5 have a value of "001" may represent that the storage device is configured with an ODP. That is, the memory device recognizes that, when the fifth select signal SEL_5 have a value of "1," the number of memory devices included in the storage device is eight.

Stack information that the third to fifth select signals SEL_3 to SEL_5 have a value of "010" may represent that the storage device is configured with a QDP. That is, the memory device recognizes that, when the fourth select signal SEL_4 has a value of "1," the number of memory devices included in the storage device is four.

Stack information that the third to fifth select signals SEL_3 to SEL_5 have a value of "100" may represent that the storage device is configured with a DDP. That is, the memory device recognizes that, when the third select signal SEL_3 having a value of "1," the number of memory devices included in the storage device is two.

In an embodiment, stack information that the third to fifth select signals SEL_3 to SEL_5 are having a value of "000" may represent that the storage device is configured with an SDP. That is, the memory device recognizes that, when the third to fifth select signals SEL_3 to SEL_5 are not input, the number of memory devices included in the storage device is one.

The select signals described with reference to FIG. 5 are merely illustrative, and select signals for identifying memory chips and select signals representing stack information may be variously set.

Through the method described with reference to FIG. 5, each memory device (or chip) recognizes a number of memory devices included in the storage device, based on stack information included in input select signals, and accordingly, an amount of delay to be applied to an internal data signal provided to the memory device can be set.

Figure 6:
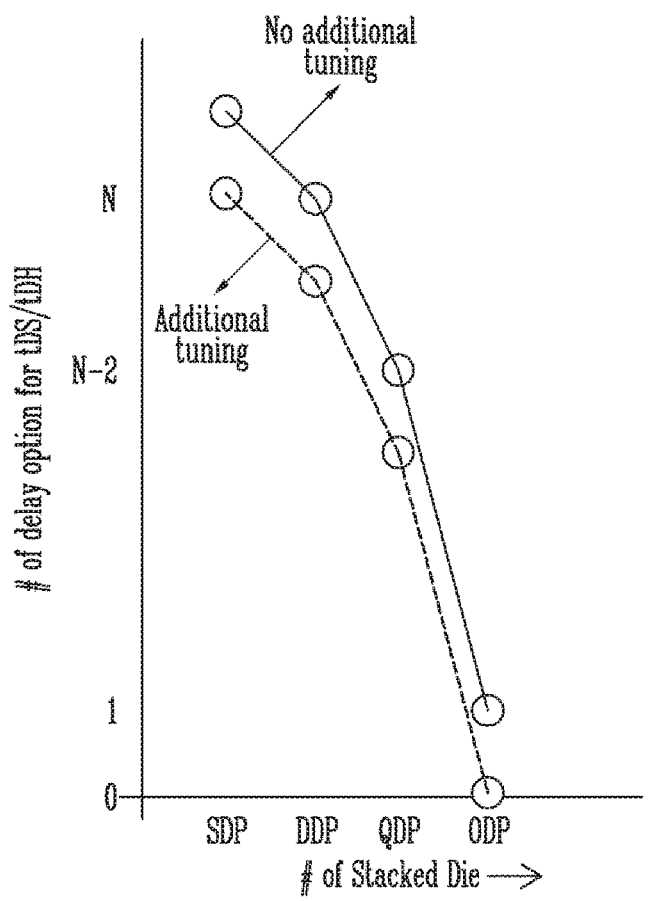
FIG. 6 is a graph illustrating amount of delay to be applied in accordance with an embodiment of the present disclosure.

FIG. 6 is a graph illustrating amount of delay to be applied in accordance with an embodiment of the present disclosure.

Referring to FIG. 6, the horizontal axis represents number of memory devices included in the storage device, and the vertical axis represents amount of delay to be applied to an input internal data signal.

In accordance with the embodiment described with reference to FIG. 2, the amount of delay to be applied to a received data signal may increase since physical loading increases as the number of memory devices increases. Therefore, the storage device in accordance with an embodiment of the present disclosure may apply the largest amount of delay to the SDP, and decrease the amount of delay as the number of memory devices increases. For example, while an internal data signal INT_DQ is being transferred through a path to which a plurality of delay generating units are coupled, an amount of delay may be applied to the internal data signal INT_DQ. In the SDP, the largest amount of delay may be applied by turning on all the plurality of delay generating units, and the number of turned-off delay generating units may increase as the number of memory devices included in the storage device increases. In an embodiment, each of the plurality of delay generating units may apply, to the internal data signal INT_DQ, a predetermined amount of delay caused by a unit capacitance thereof when turned on.

In various embodiments, the storage device may determine an amount of delay to be applied to a data signal provided to the memory device under various conditions in addition to the number of memory devices included in the storage device. That is, the third to fifth select signals SEL_3 to SEL_5 described with reference to FIG. 5 may be variously used as well as providing the memory device with stack information on the number of memory devices included in the storage device.

For example, the storage device may additionally tune the amount of delay depending on a channel length between the memory controller and the memory device. For example, when the channel length between the memory controller and the memory device is short, a large amount of delay may be additionally applied to a data signal provided to the memory device. When the channel length between the memory controller and the memory device is long, a small amount of delay may be additionally applied to a data signal provided to the memory device.

In various embodiments, the storage device may additionally tune the amount of delay depending on the kind of storage device. For example, different amount of delays may be additionally applied based on when the storage device is used in a mobile environment or when the storage device is sued in a high-capacity server.

Figure 7:
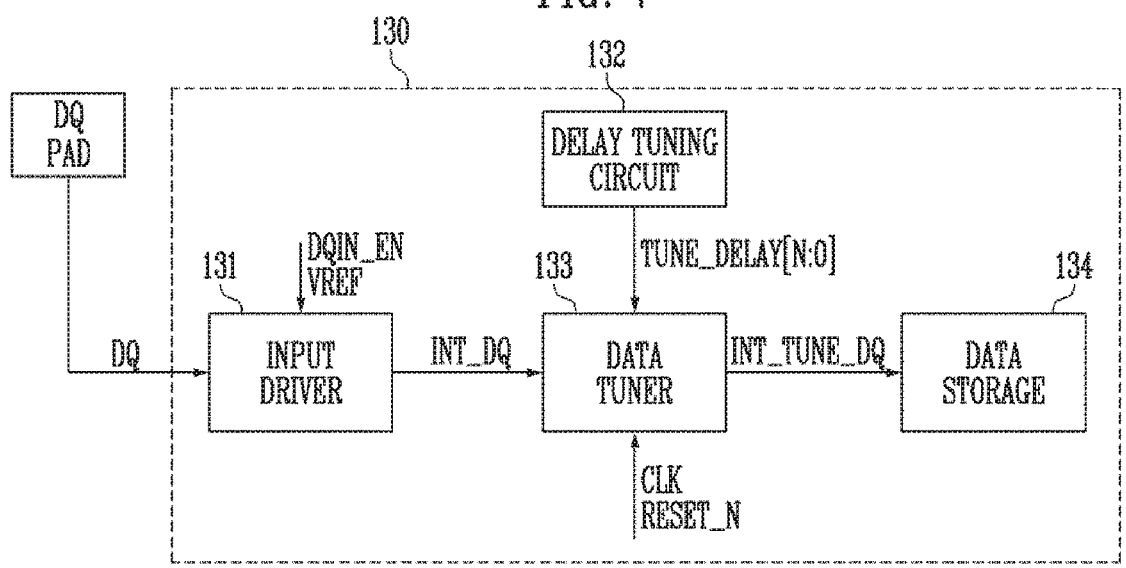
FIG. 7 is a block diagram illustrating a configuration of a control logic of FIG. 4.

FIG. 7 is a block diagram illustrating a configuration of the control logic 130 of FIG. 4.

Referring to FIG. 7, the control logic 130 may include an input driver 131, a delay tuning circuit 132, a data tuner 133, and a data storage 134.

The input driver 131 may receive a data signal DQ input through a data input/output pad DQ PAD in response to an input enable signal DQIN_EN. In an embodiment, the data input/output pad DQ PAD may be the data signal pad assembly 42 described with reference to FIG. 4. Alternatively, the data input/output pad DQ PAD may be a pad coupled to the input/output lines DQ0 to DQ7 described with reference to FIG. 2.

The input driver 131 may receive a reference voltage VREF and the input enable signal DQIN_EN. The input driver 131 may output an internal data signal INT_DQ having a high or low state by comparing the received data signal DQ with the reference voltage VREF.

The delay tuning circuit 132 may generate a delay tuning signal TUNE_DELAY[N:0] for determining an amount of delay to be applied to the internal data signal INT_DQ. The delay tuning circuit 132 may generate the delay tuning signal TUNE_DELAY[N:0] in response to a delay tuning command input from the memory controller. When the delay tuning command is input, the delay tuning circuit 132 may receive stack information through select signals (e.g., the third to fifth select signals SEL_3 to SEL_5) from the memory controller 200. The delay tuning circuit 132 may generate delay tuning signal TUNE_DELAY[N:0] for determining the amount of delay to be applied to the internal data signal INT_DQ of the memory device, based on the stack information.

The data tuner 133 receives the internal data signal INT_DQ from the input driver 131. The data tuner 133 may output a data signal INT_TUNE_DQ tuned by applying an amount of delay, which is determined according to the delay tuning signal TUNE_DELAY[N:0] output from the delay tuning circuit 132, to the internal data signal INT_DQ.

The data storage 134 may store the tuned data signal INT_TUNE_DQ.

Figure 8:
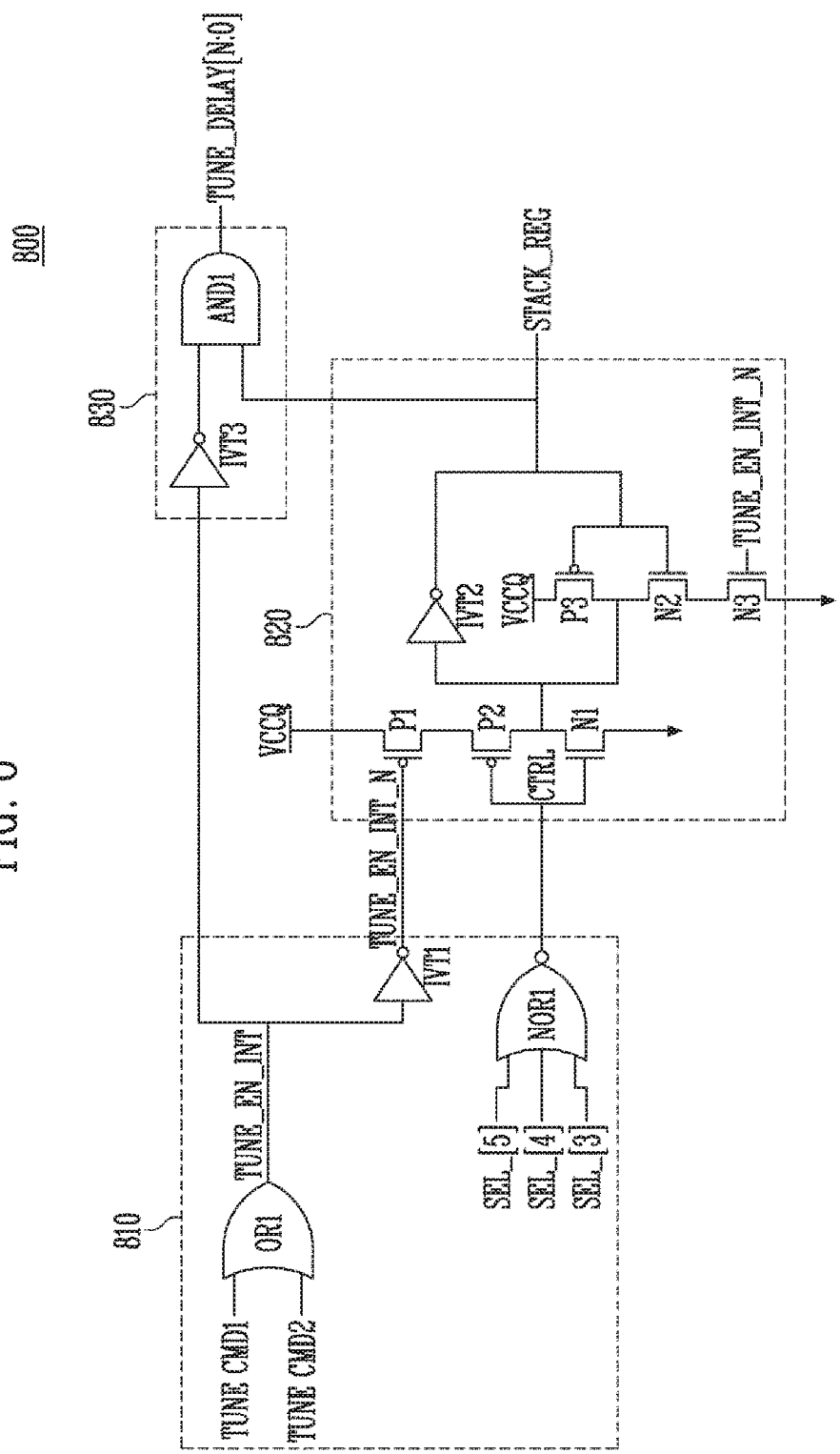
FIG. 8 is a circuit diagram illustrating a delay tuning circuit of FIG. 7.

FIG. 8 is a circuit diagram illustrating a delay tuning circuit, for example, that of FIG. 7.

Referring to FIG. 8, a delay tuning circuit 800 may include an input signal generator 810, a delay tuning signal generator 820, and a delay tuning signal output component 830.

The input signal generator 810 may receive a delay tuning command TUNE CMD1 or TUNE CMD2. The delay tuning command TUNE CMD1 or TUNE CMD2 may be provided from the memory controller described with reference to FIG. 1.

When the delay tuning command TUNE CMD1 or TUNE CMD2 is received, the input signal generator 810 may provide a delay tuning enable signal TUNE_EN_INT and an inverted delay tuning enable signal TUNE_EN_INT_N, the former of which is applied to the delay tuning signal output component 830, and the latter of which is applied to the delay tuning signal generator 820 and more specifically to the gates of transistors P1 and N3.

The input signal generator 810 may receive select signals (e.g., the third to fifth select signals SEL_3 to SEL_5). Specifically, the input signal generator 810 may receive select signals input through some select signal pads among the plurality of select signal pads SEL_0 to SEL_5 included in the memory device. In an embodiment, the select signals SEL_3 to SEL_5 received by the input signal generator 810 may include the stack information described with reference to FIG. 4 or 5.

The input signal generator 810 may receive select signals SEL_3 to SEL_5, and provide an internal control signal CTRL to the delay tuning signal generator 820 in response to the select signals SEL_3 to SEL_5.

The delay tuning signal generator 820 may generate a stack register signal STACK_REG in response to the delay tuning enable signal TUNE_EN_INT, the inverted delay tuning enable signal TUNE_EN_INT_N, and the internal control signal CTRL. Specifically, the delay tuning signal generator 820 may determine an amount of delay to be applied to the internal data signal INT_DQ according to the internal control signal CTRL. For example, the delay tuning signal generator 820 may identify a number of memory devices included in the storage device according to the internal control signal CTRL. The delay tuning signal generator 820 generates the stack register signal STACK_REG that is a signal representing the amount of delay to be applied to the internal data signal INT_DQ in response to the internal control signal CTRL.

The delay tuning signal output component 830 may output a delay tuning signal TUNE_DELAY[N:0], based on the inverted delay tuning enable signal TUNE_EN_INT_N and the stack register signal STACK_REG.

The delay tuning circuit 132 described with reference to FIG. 7 may be configured and operated identically to the delay tuning circuit 800.

In FIG. 8, the delay tuning signal TUNE_DELAY[N:0] is generated using the select signals SEL_3 to SEL_5. However, the present disclosure is not limited thereto. In various embodiments, a delay tuning signal TUNE_DELAY[N:0] corresponding to a number of memory devices may be stored in advance. The stored delay tuning signal TUNE_DELAY[N:0] may be stored in a specific area of the memory device. The memory device may select a delay tuning signal TUNE_DELAY[N:0] for determining an amount of delay to be applied to the internal data signal INT_DQ that is a data signal input to the memory device, using the select signals SEL_3 to SEL_5.

FIG. 9 is a diagram illustrating an embodiment of the delay tuning signal TUNE_DELAY[N:0] generated by the delay tuning circuit 800 of FIG. 8.

In FIG. 9, an example in which a delay tuning signal TUNE_DELAY[7:0] is configured with eight bits is illustrated. However, in various embodiments, the bit length of the delay tuning signal TUNE_DELAY[7:0] may be different.

Referring to FIG. 9, the delay tuning signal TUNE_DELAY[7:0] may have a smaller value as the number of memory devices included in the storage device increases.

For example, when the storage device is configured with an SDP, the delay tuning signal TUNE_DELAY[7:0] may have a value of "01111111." When the storage device is configured with a QDP, the delay tuning signal TUNE_DELAY[7:0] may have a value of "00000001."

That is, in accordance with the embodiment of FIG. 9, the delay tuning signal TUNE_DELAY[7:0] is set to have a smaller value as the number of memory devices included in the storage device increases.

Figure 10:
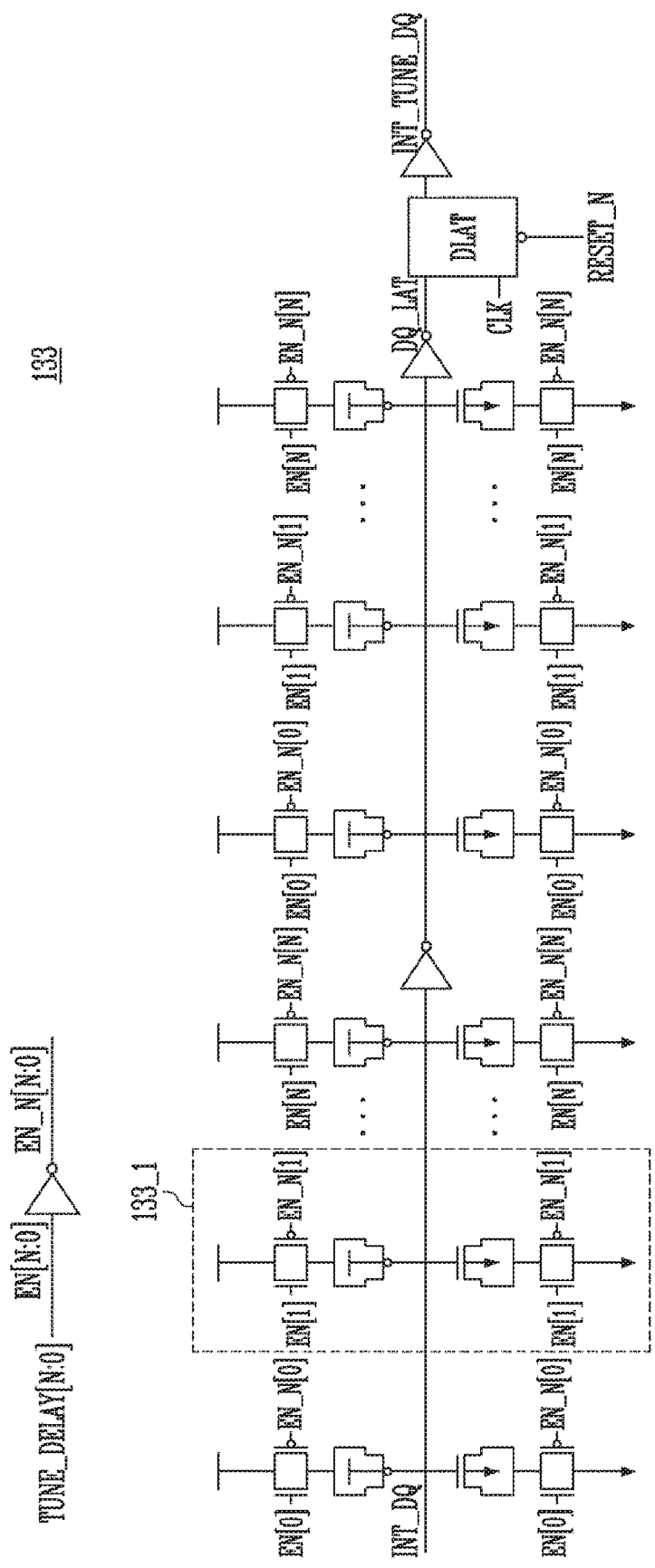
FIG. 10 is a circuit diagram illustrating a configuration of a data tuner of FIG. 7.

FIG. 10 is a circuit diagram illustrating a configuration of the data tuner 133 of FIG. 7.

Referring to FIG. 10, the data tuner 133 may receive may receive a delay tuning signal TUNE_DELAY[N:0] generated by the delay tuning circuit 132 of FIG. 7.

Also, the data tuner 133 may receive an internal data signal INT_DQ output from the input driver 131 of FIG. 7.

The data tuner 133 may include a plurality of delay generating units 133_1. The delay tuning signal TUNE_DELAY[N:0] may be input as a control signal of the delay generating unit 133_1. Specifically, the delay tuning signal TUNE_DELAY[N:0] and an inverted delay tuning signal TUNE_DELAY_N[N:0] may be respectively input as an enable signal EN[N:0] and an inverted enable signal EN_N[N:0] of the plurality of delay generating units 133_1.

The plurality of delay generating units 133_1 may delay the input internal data signal INT_DQ according to the enable signal EN[N:0] and the inverted enable signal EN_N[N:0].

Thus, according to the delay tuning signal TUNE_DELAY[7:0] described with reference to FIG. 9, the delay tuning signal TUNE_DELAY[7:0] may be enable a larger number of delay generating units 133_1 as the number of memory devices included in the storage device decreases.

The data tuner 133 may store, in a data latch DLAT in response to a clock signal CLK, the data signal INT_TUNE_DQ tuned by delaying the internal data signal INT_DQ by an amount of delay determined according to the delay tuning signal TUNE_DELAY[N:0].

Figure 11:
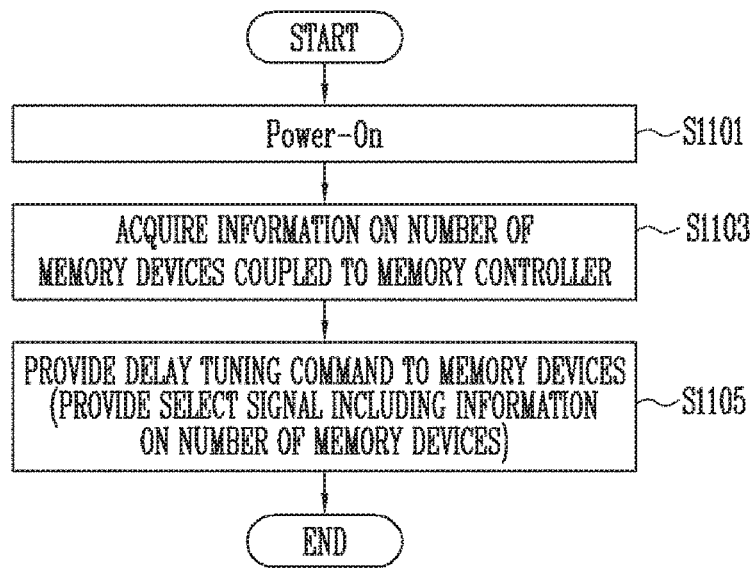
FIG. 11 is a flowchart illustrating an operation of the memory controller in accordance with an embodiment of the present disclosure.

FIG. 11 is a flowchart illustrating an operation of a memory controller, e.g., memory controller 200, in accordance with an embodiment of the present disclosure.

Referring to FIG. 11, in step S1101, power is supplied to the memory controller.

In step S1103, the memory controller may acquire information on a number of memory devices coupled to the memory controller. Specifically, the memory controller may recognize a number of memory devices controlled by the memory controller through an initial setting operation of the memory devices coupled to the memory controller.

In step S1105, the memory controller may provide a delay tuning command to the memory devices. Specifically, when the memory devices receive data provided by the memory controller, the memory controller may provide a delay tuning command instructing each memory device to tune an amount of delay to be applied to the received data. The memory controller may select each memory device, and provide a delay tuning command to the corresponding memory device. The memory controller may provide select signals to each memory device, and select the corresponding memory device. In an embodiment, the select signals may include select signals for identifying the corresponding memory device and select signals for providing stack information representing the number of memory devices controlled by the memory controller.

Figure 12:
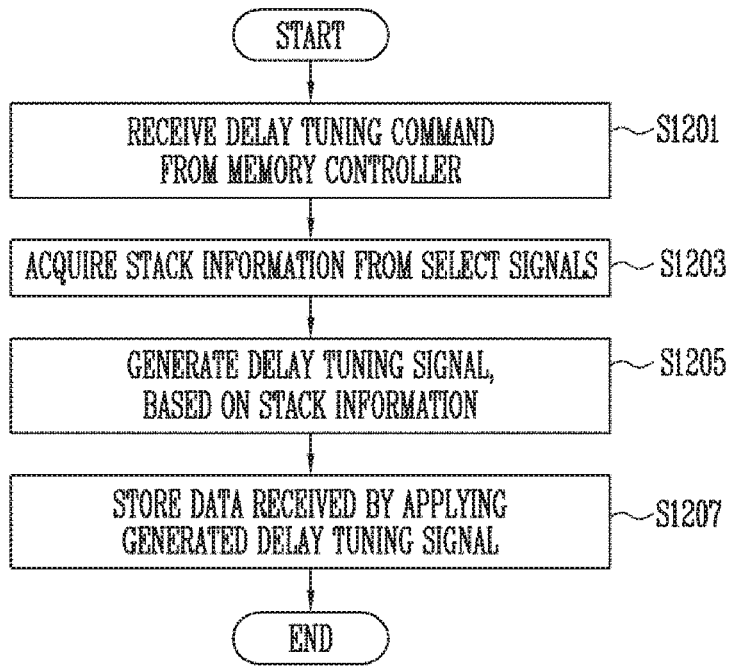
FIG. 12 is a flowchart illustrating an operation of the memory device in accordance with an embodiment of the present disclosure.

FIG. 12 is a flowchart illustrating an operation of the memory device, e.g., memory device 100, in accordance with an embodiment of the present disclosure.

Referring to FIG. 12, in step S1201, the memory device may receive a delay tuning command from the memory controller.

In step S1203, the memory device may acquire stack information from select signals.

Specifically, when the delay tuning command is received from the memory controller, the memory device may receive select signals. Some of the select signals may represent that a corresponding memory device has been selected, and the other select signals may include stack information. In an embodiment, the stack information may be information on a number of memory devices controlled by the memory controller.

In step S1205, the memory device may generate a delay tuning signal, based on the stack information. Specifically, the memory device may generate a delay tuning signal for applying a smaller amount of delay as the number of memory devices controlled by the memory controller increases, based on the stack information.

In step S1207, the memory device may store data, to which an amount of delay is applied according to the delay tuning signal.

Figure 13:
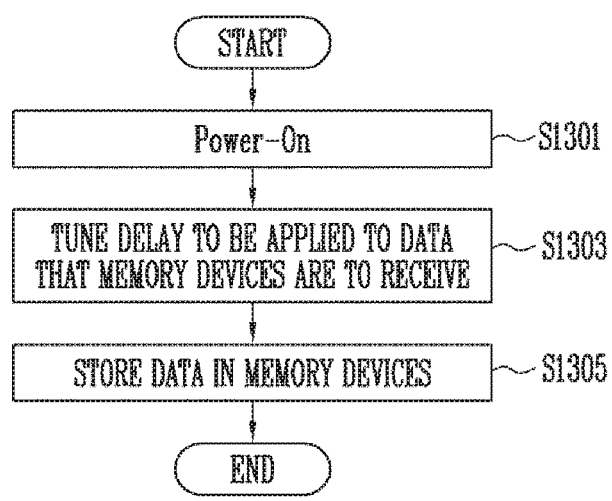
FIG. 13 is a flowchart illustrating an operation of the storage device in accordance with an embodiment of the present disclosure.

FIG. 13 is a flowchart illustrating an operation of a storage device, e.g., storage device 50, in accordance with an embodiment of the present disclosure.

Referring to FIG. 13, in step S1301, power may be supplied to the storage device.

In step S1303, the storage device may tune an amount of delay to be applied to data that memory devices included in the storage device are to receive. Each memory device may receive stack information from the memory controller. Therefore, each memory device may generate a delay tuning signal for determining an amount of delay to be applied to data that the memory device receives.

In step S1305, the storage device may perform a program operation of storing data, to which an amount of delay is applied according to the delay tuning signal, in the respective memory devices.

Figure 14:
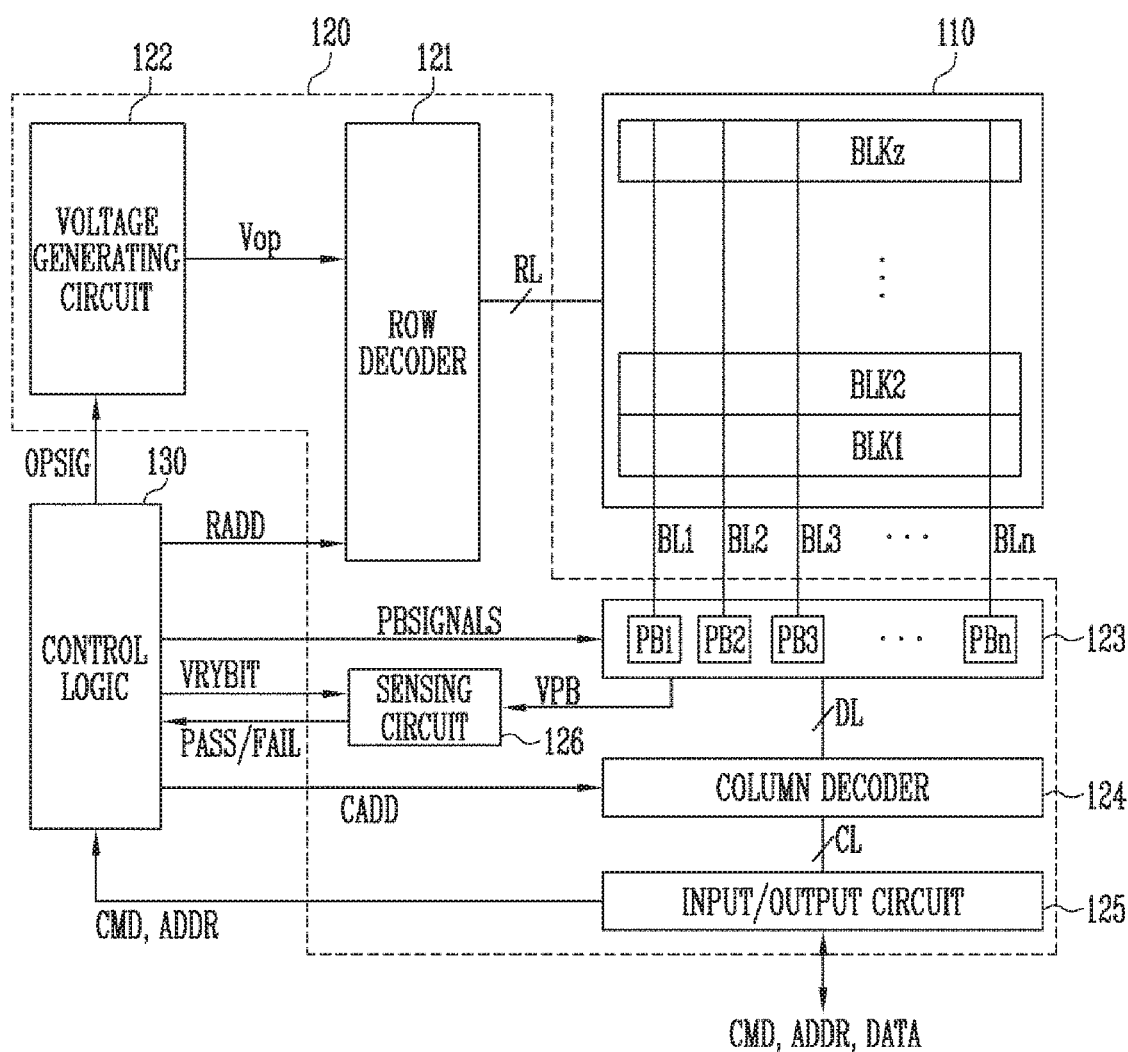
FIG. 14 is a diagram illustrating an exemplary structure of the memory device of FIG. 1.

FIG. 14 is a diagram illustrating an exemplary structure of the memory device 100 of FIG. 1.

Referring to FIG. 14, the memory device 100 may include a memory cell array 110, a peripheral circuit 120, and a control logic 130.

The memory cell array 110 includes a plurality of memory blocks BLK1 to BLKz. The plurality of memory blocks BLK1 to BLKz are coupled to a row decoder 121 through row lines RL. The plurality of memory blocks BLK1 to BLKz may be coupled to a page buffer group 123 through bit lines BL1 to BLn. Each of the plurality of memory blocks BLK1 to BLKz includes a plurality of memory cells. In an embodiment, the plurality of memory cells are nonvolatile memory cells. Memory cells coupled to the same word line may be defined as one page. Therefore, one memory block may include a plurality of pages.

The row lines RL may include at least one source select line, a plurality of word lines, and at least one drain select line.

Each of the memory cells included in the memory cell array 110 may be configured as a Single Level Cell (SLC) for storing one data bit. Also, each of the memory cells included in the memory device 100 may be configured as a Multi-Level Cell (MLC) for storing two data bits, a Triple Level Cell (TLC) for storing three data bits, or a Quad Level Cell (QLC) for storing four data bits.

The peripheral circuit 120 may be configured to perform a program operation, a read operation or an erase operation in a selected area of the memory cell array 110 under the control of the control logic 130. The peripheral circuit 120 may drive the memory cell array 110. For example, the peripheral circuit 120 may apply various operating voltages to the row lines RL and the bit lines BL1 to BLn under the control of the control logic 130, or discharge the applied voltages.

The peripheral circuit 120 may include the row decoder 121, a voltage generating circuit 122, the page buffer group 123, a column decoder 124, and an input/output circuit 125.

The row decoder 121 is coupled to the memory cell array through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 may operate under the control of the control logic 130. The row decoder 121 receives a row address ADDR from the control logic 130.

The row decoder 121 is configured to decode the row address RADD. The row decoder 121 selects at least one memory block among the memory blocks BLK1 to BLKz according to the decoded address. Also, the row decoder 121 may select at least one word line of the selected memory block to apply voltages generated by the voltage generating circuit 122 to at least one word line WL according to the decoded address.

For example, in a program operation, the row decoder 121 may apply a program voltage to the selected word line, and apply a program pass voltage having a level lower than that of the program voltage to unselected word lines. In a program verify operation, the row decoder 121 may apply a verify voltage to the selected word line, and apply a verify pass voltage higher than the verify voltage to the unselected word lines. In a read operation, the row decoder 121 may apply a read voltage to the selected word line, and apply a read pass voltage higher than the read voltage to the unselected word lines.

In an embodiment, an erase operation of the memory device 100 is performed in units of memory blocks. In the erase operation, the row decoder 121 may select one memory block according the decoded address. In the erase operation, the row decoder 121 may apply a ground voltage to word lines coupled to the selected memory block.

The voltage generating circuit 122 operates under the control of the control logic 130. The voltage generating circuit 122 may generate a plurality of voltages by using an external power voltage supplied to the memory device 100. Specifically, the voltage generating circuit 122 may generate various operating voltages Vop used for program, read, and erase operation in response to an operation signal OPSIG. For example, the voltage generating circuit 122 may generate a program voltage, a verify voltage, a pass voltage, a read voltage, an erase voltage, and the like under the control of the control logic 130.

In an embodiment, the voltage generating circuit 122 may generate an internal power voltage by regulating the external power voltage. The internal power voltage generated by the voltage generating circuit 122 is used as an operation voltage of the memory device 100.

In an embodiment, the voltage generating circuit 122 may generate a plurality of voltages by using the external power voltage or the internal power voltage.

For example, the voltage generating circuit 122 may include a plurality of pumping capacitors for receiving the internal power voltage, and generate a plurality of voltages by selectively activating the plurality of pumping capacitors under the control of the control logic 130.

The plurality of generated voltages may be supplied to the memory cell array 110 by the row decoder 121.

The page buffer group 123 includes first to nth page buffers PB1 to PBn. The first to nth page buffers PB1 to PBn are coupled to the memory cell array 110 respectively through the first to nth bit lines BL1 to BLn. The first to nth page buffers PB1 to PBn operate under the control of the control logic 130. Specifically, the first to nth page buffers PB1 to PBn may operate in response to page buffer control signals PBSIGNALS. For example, the first to nth page buffers PB1 to PBn may temporarily store data received through the first to nth bit lines BL1 to BLn, or sense voltages or currents of the bit lines BL1 to BLn in a read or verify operation.

Specifically, in a program operation, the first to nth page buffers PB1 to PBn may transfer, to selected memory cells, data DATA received through the input/output circuit 125, when a program voltage is applied to a selected word line. The memory cells of the selected page may be programmed according to the transferred data DATA. A memory cell coupled to a bit line to which a program allowable voltage (e.g., a ground voltage) is applied may have an increased threshold voltage. The threshold voltage of a memory cell coupled to a bit line to which a program inhibit voltage (e.g., a power voltage) is applied may be maintained. In a program verify operation, the first to nth page buffers PB1 to PBn read page data from the selected memory cells through the bit lines BL1 to BLn.

In a read operation, the first to nth page buffers PB1 to PBn may read data DATA from memory cells of a selected page through the first to nth bit lines BL1 to BLn, and output the read data DATA to the input/output circuit 125 under the control of the column decoder 124.

In an erase operation, the first to nth page buffers PB1 to PBn may float the first to nth bit lines BL1 to BLn.

The column decoder 124 may transfer data between the input/output circuit 125 and the page buffer group 123 in response to a column address CADD. For example, the column decoder 124 may exchange data with the first to nth page buffers PB1 to PBn through data lines DL, or exchange data with the input/output circuit 125 through column lines CL.

The input/output circuit 125 may transfer a command CMD and an address ADDR, which are received from the memory controller 200 described with reference to FIG. 1, to the control logic 130, or exchange data DATA with the column decoder 124.

In a read operation or a verify operation, a sensing circuit 126 may generate a reference current in response to an allowable bit signal VRYBIT, and output a pass signal PASS or a fail signal FAIL by comparing a sensing voltage VPB received from the page buffer group 123 with a reference voltage generated by the reference current.

The control logic 130 may control the peripheral circuit by outputting the operation signal OPSIG, the row address RADD, the page buffer control signals PBSIGNALS, and the allowable bit signal VRYBIT in response to the command CMD and the address ADDR. Also, the control logic 130 may determine whether the verify operation has passed or failed in response to the pass or fail signal PASS or FAIL.

The control logic 130 of FIG. 14 may be operated identically to the control logic 130 described with reference to FIG. 7.

Figure 15:
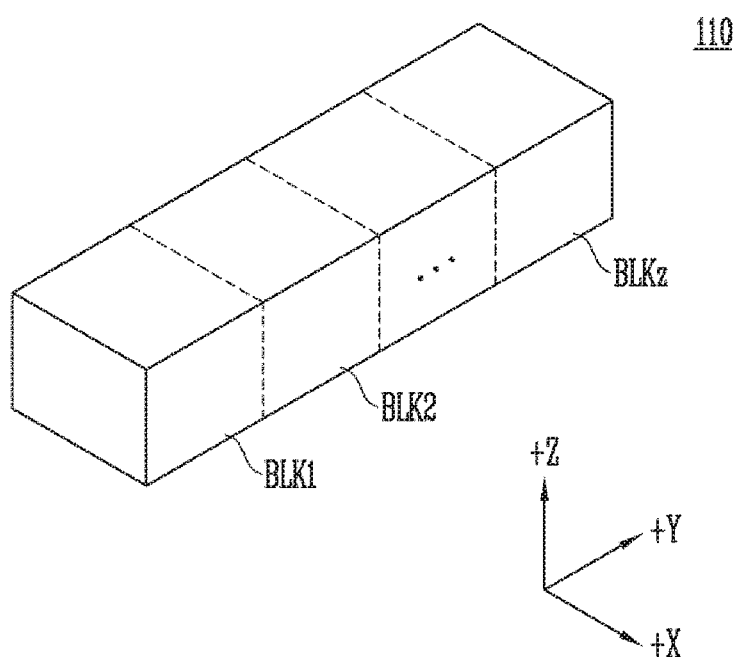
FIG. 15 is a diagram illustrating an embodiment of a memory cell array of FIG. 14.

FIG. 15 is a diagram illustrating an embodiment of the memory cell array of FIG. 14.

Referring to FIG. 15, the memory cell array 110 may include a plurality of memory blocks BLK1 to BLKz. Each memory block may have a three-dimensional structure. Each memory block may include a plurality of memory cells stacked on a substrate (not shown). The plurality of memory cells may be arranged along +X, +Y, and +Z directions. A structure of each memory block will be described in more detail with reference to FIGS. 16 and 17.

Figure 16:
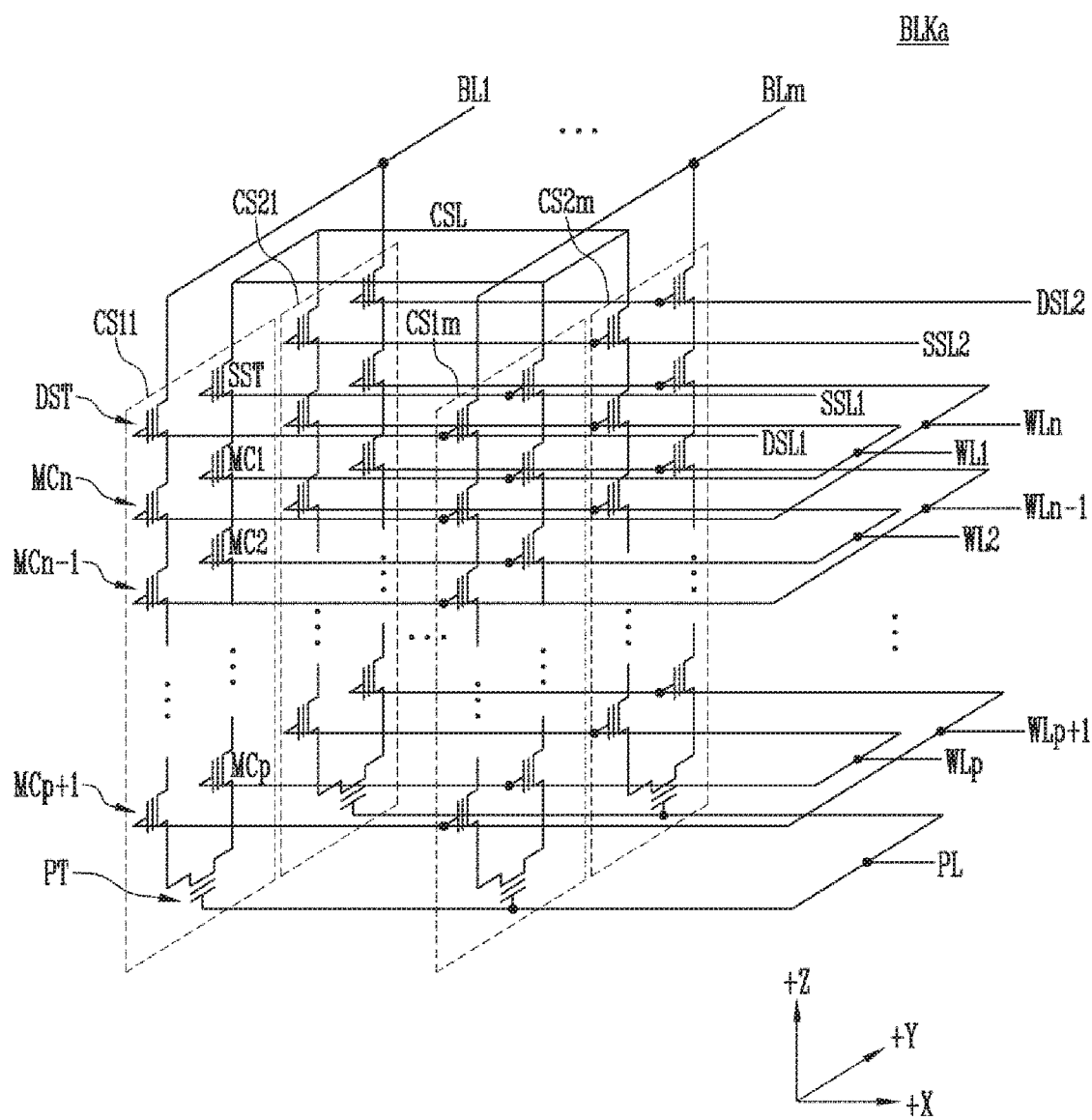
FIG. 16 is a circuit diagram illustrating any one memory block among memory blocks of FIG. 15.

FIG. 16 is a circuit diagram illustrating any one memory block BLKa among the memory blocks BLK1 to BLKz of FIG. 15.

Referring to FIG. 16, the memory block BLKa may include a plurality of cell strings CS11 to CS1m and CS21 to CS2m. In an embodiment, each of the plurality of cell strings CS11 to CS1m and CS21 to CS2m may be formed in a 'U' shape. In the memory block BLKa, m cell strings are arranged in a row direction (i.e., a +X direction). Although FIG. 16 illustrates two cell strings arranged in a column direction (i.e., a +Y direction), the present disclosure is not limited thereto. Three or more cell strings may be arranged in the column direction.

Each of the plurality of cell strings CS11 to CS1m and CS21 to CS2m may include at least one source select transistor SST, first to nth memory cells MC1 to MCn, a pipe transistor PT, and at least one drain select transistor DST.

The select transistors SST and DST and the memory cells MC1 to MCn may have structures similar to one another. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between a common source line CSL and memory cells MC1 to MCp.

In an embodiment, the source select transistors of cell strings arranged on the same row are coupled to a source select line extending in the row direction, and the source select transistors of cell strings arranged on different rows are coupled to different source select lines. In FIG. 16, the source select transistors of the cell strings CS11 to CS1m on a first row are coupled to a first source select line SSL1. The source select transistors of the cell strings CS21 to CS2m on a second row are coupled to a second source select line SSL2.

In another embodiment, the source select transistors of the cell strings CS11 to CS1m and CS21 to CS2m may be commonly coupled to one source select line.

The first to nth memory cells MC1 to MCn of each cell string are coupled between the source select transistor SST and the drain select transistor DST.

The first to nth memory cells MC1 to MCn may be divided into first to pth memory cells MC1 to MCp and a (p+1)th to nth memory cells MCp+1 to MCn. The first to pth memory cells MC1 to MCp are sequentially arranged in the opposite direction of a +Z direction, and are coupled in series between the source select transistor SST and the pipe transistor PT. The (p+1)th to nth memory cells MCp+1 to MCn are sequentially arranged in the +Z direction, and are coupled in series between the pipe transistor PT and the drain select transistor DST. The first to pth memory cells MC1 to MCp and the (p+1)th to nth memory cells MCp+1 to MCn are coupled through the pipe transistor PT. Gate electrodes of the first to nth memory cells MC1 to MCn of each cell string are coupled to first to nth word lines WL1 to WLn, respectively.

A gate of the pipe transistor PT of each cell string is coupled to a pipe line PL.

The drain select transistor DST of each cell string is coupled between a corresponding bit line and the memory cells MCp+1 to MCn. Cell strings arranged in the row direction are coupled to a drain select line extending in the row direction. The drain select transistors of the cell strings CS11 to CS1m on the first row are coupled to a first drain select line DSL1. The drain select transistors of the cell strings CS21 to CS2m on the second row are coupled to a second drain select line DSL2.

Cell strings arranged in the column direction are coupled to a bit line extending in the column direction. In FIG. 16, the cell strings CS11 and CS21 on a first column are coupled to a first bit line BL1. The cell strings CS1m and CS2m on an mth column are coupled to an mth bit line BLm.

Memory cells coupled to the same word line in the cell strings arranged in the row direction constitute one page. For example, memory cells coupled to the first word line WL1 in the cell strings CS11 to CS1m on the first row constitute one page. Memory cells coupled to the first word line WL1 in the cell strings CS21 to CS2m on the second row constitute another page. As any one of the drain select lines DSL1 and DSL2 is selected, cell strings arranged in one row direction may be selected. As any one of the word lines WL1 to WLn is selected, one page may be selected in the selected cell strings.

In another embodiment, even bit lines and odd bit lines may be provided instead of the first to mth bit lines BL1 to BLm. In addition, even-numbered cell strings among the cell strings CS11 to CS1m or CS21 to CS2m arranged in the row direction may be coupled to the even bit lines, respectively, and odd-numbered cell strings among the cell strings CS11 to CS1m or CS21 to CS2m arranged in the row direction may be coupled to the odd bit lines, respectively.

In an embodiment, at least one of the first to nth memory cells MC1 to MCn may be used as a dummy memory cell. For example, the dummy memory cell(s) may be provided to decrease an electric field between the source select transistor SST and the memory cells MC1 to MCp. Alternatively, the dummy memory cell(s) may be provided to decrease an electric field between the drain select transistor DST and the memory cells MCp+1 to MCn. When the number of dummy memory cells increases, the reliability of an operation of the memory block BLKa is improved. On the other hand, the size of the memory block BLKa increases. When the number of dummy memory cells decreases, the size of the memory block BLKa decreases. On the other hand, the reliability of an operation of the memory block BLKa may be deteriorated.

In order to efficiently control the dummy memory cell(s), each may have a required threshold voltage. Before or after an erase operation of the memory block BLKa, a program operation may be performed on all or some of the dummy memory cells. When an erase operation is performed after the program operation is performed, the threshold voltage of the dummy memory cells control a voltage applied to the dummy word lines coupled to the respective dummy memory cells, so that the dummy memory cells can have the required threshold voltage.

Figure 17:
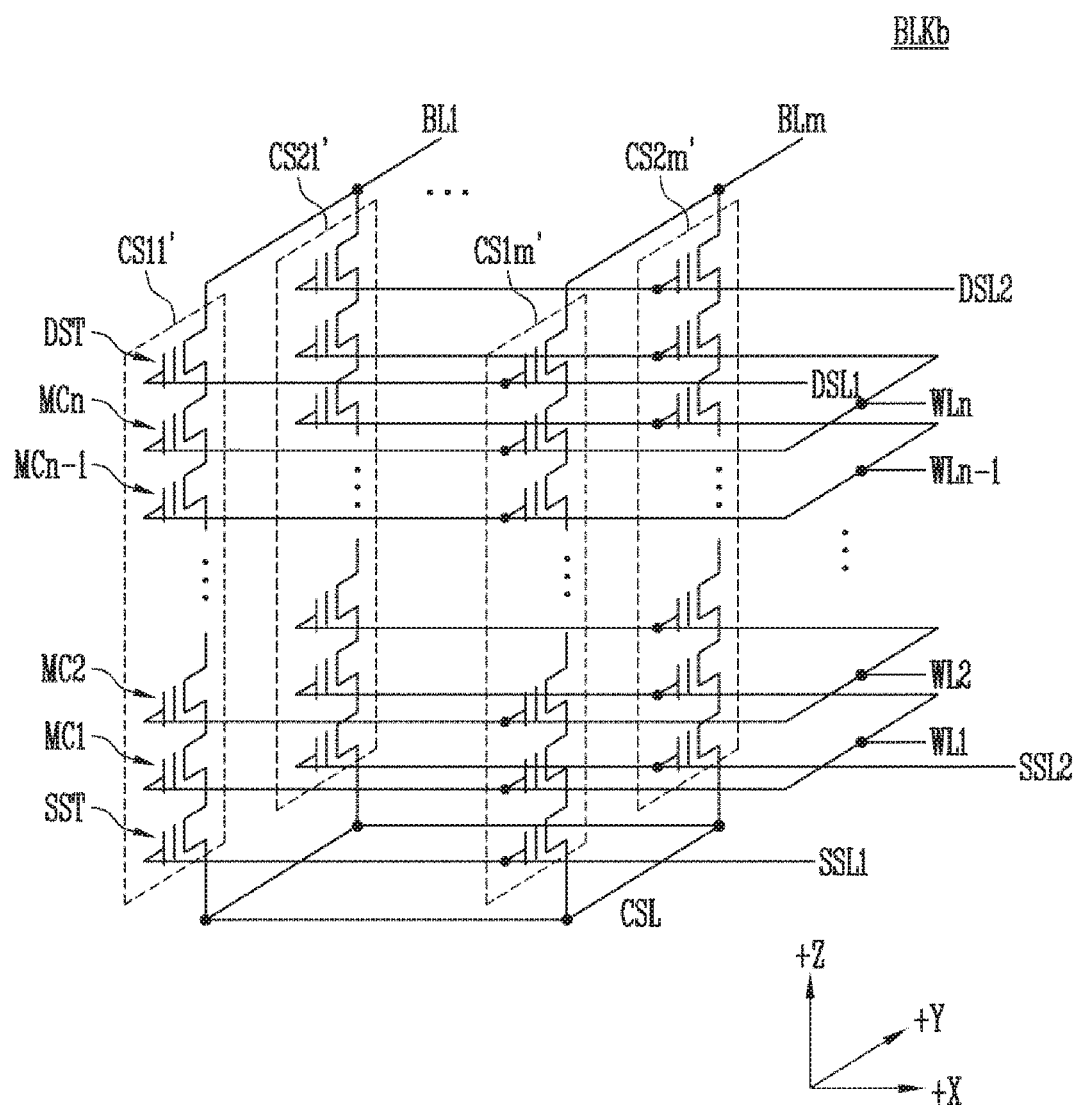
FIG. 17 is a circuit diagram illustrating another embodiment of any one memory block among the memory blocks of FIG. 15.

FIG. 17 is a circuit diagram illustrating another embodiment BLKb of the one memory block among the memory blocks BLK1 to BLKz of FIG. 15.

Referring to FIG. 17, the memory block BLKb may include a plurality of cell strings CS11' to CS1m' and CS21' to CS2m'. Each of the plurality of cell strings CS11' to CS1m' and CS21' to CS2m' extends along the +Z direction. Each of the plurality of cell strings CS11' to CS1m' and CS21' to CS2m' includes at least one source select transistor SST, first to nth memory cells MC1 to MCn, and at least one drain select transistor DST, which are stacked on a substrate (not shown) under the memory block BLKb.

The source select transistor SST of each cell string is coupled between a common source line CSL and the memory cells MC1 to MCn. The source select transistors of cell strings arranged on the same row are coupled to the same source select line. The source select transistors of the cell strings CS11' to CS1m' arranged on a first row are coupled to a first source select line SSL1. Source select transistors of the cell strings CS21' to CS2m' arranged on a second row are coupled to a second source select line SSL2. In another embodiment, the source select transistors of the cell strings CS11' to CS1m' and CS21' to CS2m' may be commonly coupled to one source select line.

The first to nth memory cells MC1 to MCn of each cell string are coupled in series between the source select transistor SST and the drain select transistor DST. Gate electrodes of the first to nth memory cells MC1 to MCn are coupled to first to nth word lines WL1 to WLn, respectively.

The drain select transistor DST of each cell string is coupled between a corresponding bit line and the memory cells MC1 to MCn. The drain select transistors of cell strings arranged in the row direction are coupled to a drain select line extending in the row direction. The drain select transistors of the cell strings CS11' to CS1m' on the first row are coupled to a first drain select line DSL1. The drain select transistors of the cell strings CS21' to CS2m' on the second row are coupled to a second drain select line DSL2.

Consequently, the memory block BLKb of FIG. 17 has a circuit similar to that of the memory block BLKa of FIG. 16, except that the pipe transistor PT is excluded from each cell string in FIG. 17.

In another embodiment, even bit lines and odd bit lines may be provided instead of the first to mth bit lines BL1 to BLm. In addition, even-numbered cell strings among the cell strings CS11' to CS1m' or CS21' to CS2m' arranged in the row direction may be coupled to the even bit lines, respectively, and odd-numbered cell strings among the cell strings CS11' to CS1m' or CS21' to CS2m' arranged in the row direction may be coupled to the odd bit lines, respectively.

In an embodiment, at least one of the first to nth memory cells MC1 to MCn may be used as a dummy memory cell. For example, the dummy memory cell(s) may be provided to decrease an electric field between the source select transistor SST and the memory cells MC1 to MCp. Alternatively, the dummy memory cell(s) may be provided to decrease an electric field between the drain select transistor DST and the memory cells MCp+1 to MCn. When a larger number of dummy memory cells are provided, the reliability of an operation of the memory block BLKb is improved. On the other hand, the size of the memory block BLKb is increased. When the number of dummy memory cells decreases, the size of the memory block BLKb decreases.

On the other hand, the reliability of an operation of the memory block BLKb may be deteriorated.

In order to efficiently control the dummy memory cell(s), each may have a required threshold voltage. Before or after an erase operation of the memory block BLKb, a program operation may be performed on all or some of the dummy memory cells. When an erase operation is performed after the program operation is performed, the threshold voltage of the dummy memory cells control a voltage applied to the dummy word lines coupled to the respective dummy memory cells, so that the dummy memory cells can have the required threshold voltage.

Figure 18:
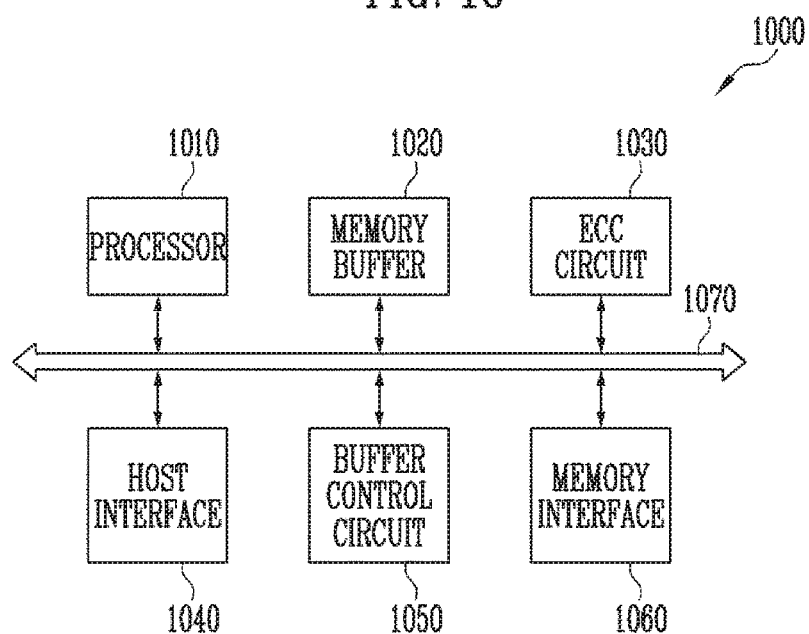
FIG. 18 is a diagram illustrating another embodiment of the memory controller of FIG. 1.

FIG. 18 is a diagram illustrating another embodiment of the memory controller 200 of FIG. 1.

A memory controller 1000 is coupled to a host and a memory device. The memory controller 1000 is configured to access the memory device in response to a request received from the host. For example, the memory controller 1000 is configured to control read, program, erase, and background operations of the memory device. The memory controller 1000 is configured to provide an interface between the memory device and the host. The memory controller 1000 is configured to drive firmware for controlling the memory device.

Referring to FIG. 18, the memory controller 1000 may include a processor 1010, a memory buffer 1020, an error correction code (ECC) circuit 1030, a host interface 1040, a buffer control circuit 1050, a memory interface 1060, and a bus 1070.

The bus 1070 may be configured to provide channels between components of the memory controller 1000.

The processor 1010 may control overall operations of the memory controller 1000, and perform a logical operation. The processor 1010 may communicate with the external host through the host interface 1040, and communicate with the memory device through the memory interface 1060. Also, the processor 1010 may communicate with the memory buffer 1020 through the buffer control circuit 1050. The processor 1010 may control an operation of the storage device, using the memory buffer 1020 as a working memory, a cache memory or a buffer memory.

The processor 1010 may perform a function of a flash translation layer (FTL). The processor 1010 may translate a logical block address (LBA) provided by the host through the FTL into a physical block address (PBA). The FTL may receive an LBA, using a mapping table, to be translated into a PBA. Several address mapping methods of the FTL exist according to mapping units. A representative address mapping method includes a page mapping method, a block mapping method, and a hybrid mapping method.

The processor 1010 is configured to randomize data received from the host. For example, the processor 1010 may randomize data received from the host, using a randomizing seed. The randomized data is provided as data to be stored to the memory device to be programmed in the memory cell array.

In a read operation, the processor 1010 is configured to derandomize data received from the memory device. For example, the processor 1010 may derandomize data received from the memory device, using a derandomizing seed. The derandomized data may be output to the host.

In an embodiment, the processor 1010 may perform randomizing and derandomizing by driving software or firmware.

The memory buffer 1020 may be used as the working memory, the cache memory, or the buffer memory of the processor 1010. The memory buffer 1020 may store codes and commands, which are executed by the processor 1010. The memory buffer 1020 may include a Static RAM (SRAM) or a Dynamic RAM (DRAM).

The ECC circuit 1030 may perform an ECC operation. The ECC circuit 1030 may perform ECC encoding on data to be written in the memory device through the memory interface 1060. The ECC encoded data may be transferred to the memory device through the memory interface 1060. The ECC circuit 1030 may perform ECC decoding on data received from the memory device through the memory interface 1060. In an example, the ECC circuit 1030 may be included as a component of the memory interface 1060 in the memory interface 1060.

The host interface 1040 may communicate with the external host under the control of the processor 1010. The host interface 1040 may communicate with the host, using at least one of various communication protocols, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a nonvolatile memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

The buffer control circuit 1050 is configured to control the memory buffer 1020 under the control of the processor 1010.

The memory interface 1060 is configured to communicate with the memory device under the control of the processor 1010. The memory interface 1060 may communicate a command, an address, and data with the memory device through a channel.

In an example, the memory controller 1000 may not include the memory buffer 1020 and the buffer control circuit 1050. Either of those components may be provided separately or its functions distributed among other components the memory controller 1000.

In an example, the processor 1010 may control an operation of the memory controller 1000 by using codes. The processor 1010 may load codes from a nonvolatile memory device (e.g., a read only memory (ROM)) provided in the memory controller 1000. In another example, the processor 1010 may load codes from the memory device through the memory interface 1060.

In an example, the bus 1070 of the memory controller 1000 may be divided into a control bus and a data bus. The data bus may be configured to transmit data in the memory controller 1000, and the control bus may be configured to transmit control information such as a command and an address in the memory controller 1000. The data bus and the control bus are separated from each other, and may not interfere or influence with each other. The data bus may be coupled to the host interface 1040, the buffer control circuit 1050, the ECC circuit 1030, and the memory interface 1060. The control bus may be coupled to the host interface 1040, the processor 1010, the buffer control circuit 1050, the memory buffer 1020, and the memory interface 1060.

Figure 19:
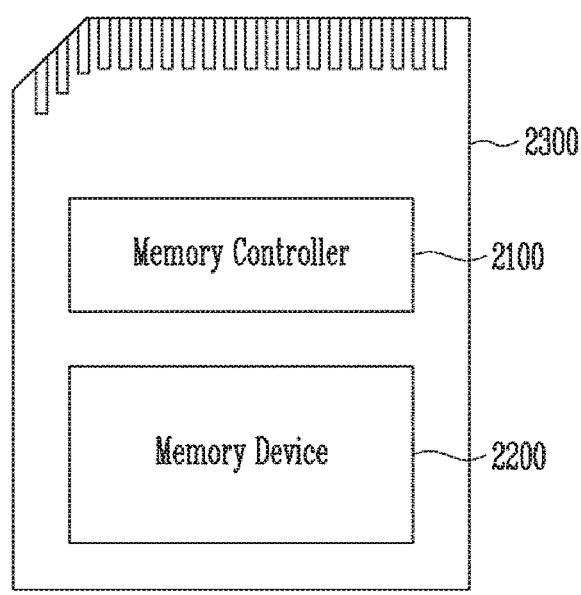
FIG. 19 is a block diagram illustrating a memory card system to which the storage device is applied in accordance with an embodiment of the present disclosure.

FIG. 19 is a block diagram illustrating a memory card system to which the storage device is applied in accordance with an embodiment of the present disclosure.

Referring to FIG. 19, the memory card system 2000 includes a memory controller 2100, a memory device, and a connector 2300.

The memory controller 2100 is coupled to the memory device 2200. The memory controller 2100 is configured to access the memory device 2200. For example, the memory controller 2100 is configured to control read, write, erase, and background operations of the memory device 2200. The memory controller 2100 is configured to provide an interface between the memory device 2200 and a host. The memory controller 2100 is configured to driver firmware for controlling the memory device 2200. The memory device 2200 may be implemented identically to the memory device 100 described with reference to FIG. 1.

In an example, the memory controller 2100 may include components such as a Random Access Memory (RAM), a processor, a host interface, a memory interface, and an ECC circuit.

The memory controller 2100 may communicate with an external device through the connector 2300. The memory controller 2100 may communicate with the external device (e.g., the host) according to a specific communication protocol. In an example, the memory controller 2100 may communicate with the external device through at least one of various communication protocols such as a Universal Serial Bus (USB), Multi-Media Card (MMC) an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe.

In an example, the memory device 2200 may be implemented with various nonvolatile memory devices such as an Electrically Erasable and Programmable ROM (EPROM), a NAND flash memory, a NOR flash memory, a Phase-change RAM (PRAM), a Resistive RAM (ReRAM), a Ferroelectric RAM (FRAM), and a Spin Torque Transfer magnetic RAM (STT-MRAM).

The memory controller 2100 and the memory device 2200 may be integrated into a single semiconductor device, to constitute a memory card. For example, the memory controller 2100 and the memory device 2200 may constitute a memory card such as a PC card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and a Universal Flash Storage (UFS).

Figure 20:
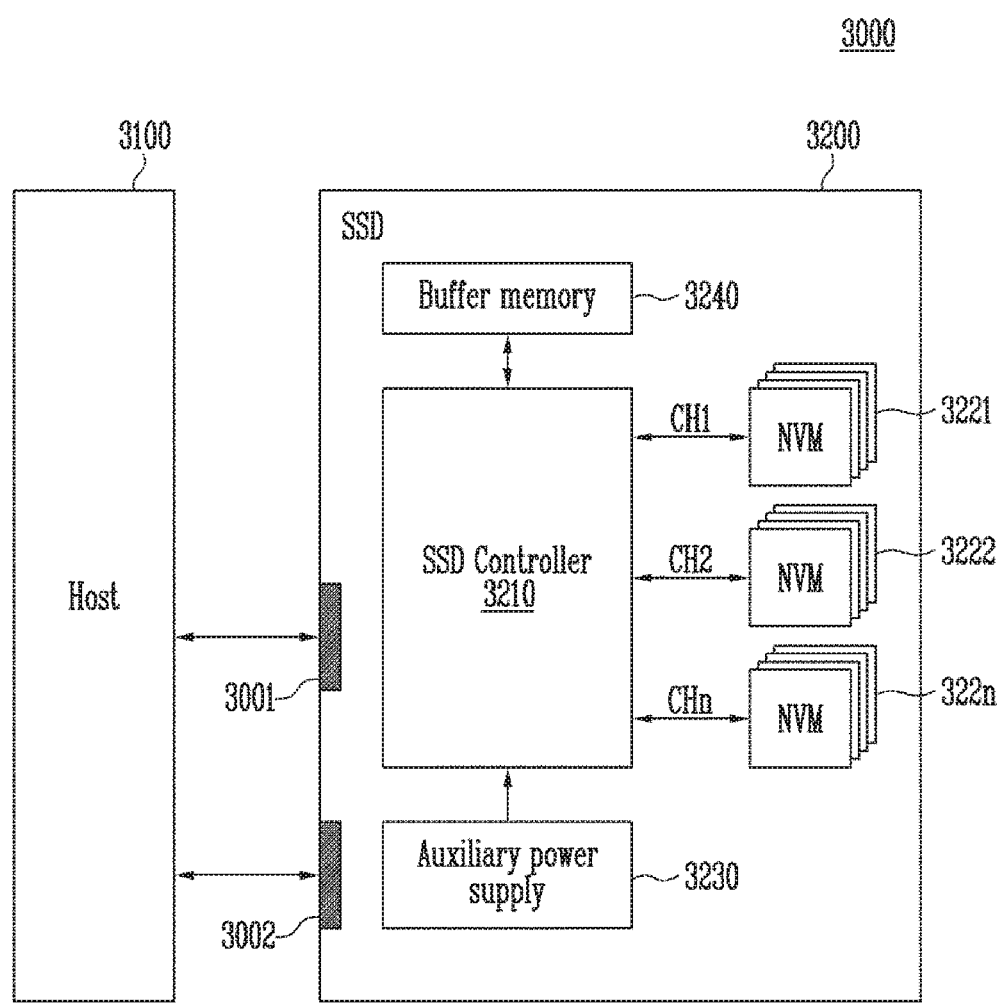
FIG. 20 is a block diagram exemplarily illustrating a Solid State Drive (SSD) system to which the storage device is applied in accordance with an embodiment of the present disclosure.

FIG. 20 is a block diagram illustrating a Solid State Drive (SSD) system to which the storage device is applied in accordance with an embodiment of the present disclosure.

Referring to FIG. 20, the SSD system 3000 includes a host 3100 and an SSD 3200. The SSD 3200 exchanges a signal SIG with the host 3100 through a signal connector 3001, and receives power PWR through a power connector 3002. The SSD 3200 includes an SSD controller 3210, a plurality of flash memories 3221 to 322n, an auxiliary power supply 3230, and a buffer memory 3240.

In an embodiment, the SSD controller 3210 may serve as the memory controller 200 described with reference to FIG. 1.

The SSD controller 3210 may control the plurality of flash memories 3221 to 322n in response to a signal SIG received from the host 3100. In an example, the signal SIG may be based on an interface between the host 3100 and the SSD 3200. For example, the signal SIG may be defined by at least one of interfaces such as a Universal Serial Bus (USB), Multi-Media Card (MMC) an embedded MMC (eMMC), Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The auxiliary power supply 3230 is coupled to the host 3100 through the power connector 3002. When the supply of power from the host 3100 is not smooth, the auxiliary power supply 3230 may provide power of the SSD 3200. In an example, the auxiliary power supply 3230 may be located in the SSD 3200, or be located at the outside of the SSD 3200. For example, the auxiliary power supply 3230 may be located on a main board, and provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or temporarily store meta data (e.g., a mapping table) of the flash memories 3221 to 322n. The buffer memory 3240 may include volatile memories such as a DRAM, an SDRAM, a DDR SDRAM, an LPDDR SDRAM, and a GRAM or nonvolatile memories such as a FRAM, a ReRAM, an STT-MRAM, and a PRAM.

Figure 21:
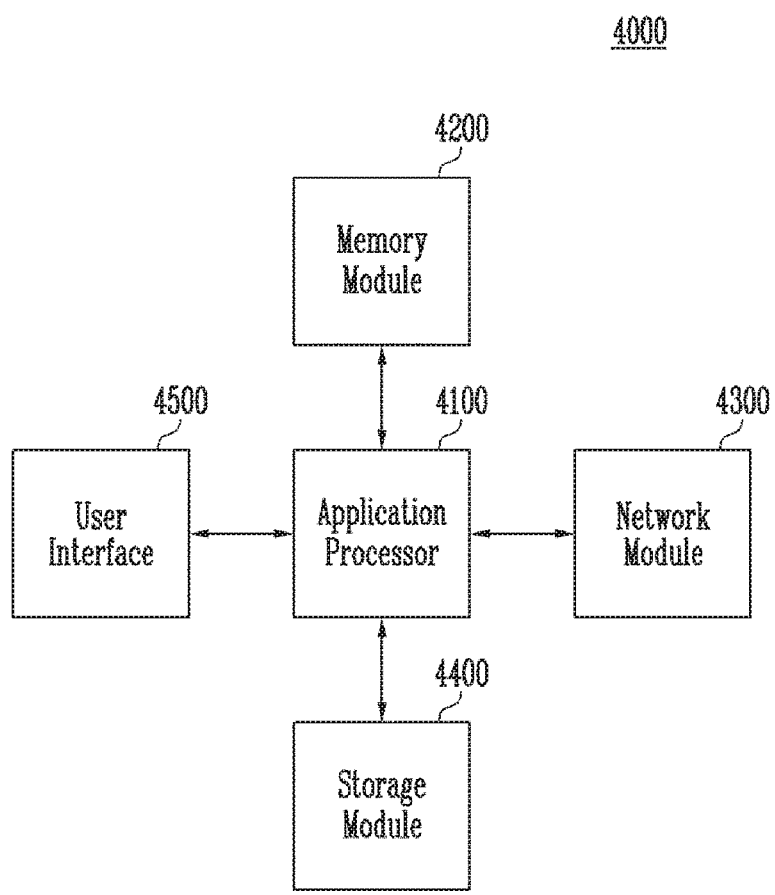
FIG. 21 is a block diagram illustrating a user system to which the storage device is applied in accordance with an embodiment of the present disclosure.

FIG. 21 is a block diagram illustrating a user system to which the storage device is applied in accordance with an embodiment of the present disclosure.

Referring to FIG. 21, the user system 4000 includes an application processor 4100, a memory module 4200, a network module 4300, a storage module 4400, and a user interface 4500.

The application processor 4100 may drive components included in the user system 4000, an operating system (OS), a user program, or the like. In an example, the application processor 4100 may include controllers for controlling components included in the user system 4000, interfaces, a graphic engine, and the like. The application processor 4100 may be provided as a System-on-Chip (SoC).

The memory module 4200 may operate as a main memory, working memory, buffer memory or cache memory of the user system 4000. The memory module 4200 may include volatile random access memories such as a DRAM, an SDRAM, a DDR SDRAM, a DDR2 SDRM, a DDR3 SDRAM, an LPDDR SDRAM, an LPDDR2 SDRAM, and an LPDDR3 SDRAM or nonvolatile random access memories such as a PRAM, a ReRAM, an MRAM, and a FRAM. In an example, the application processor 4100 and the memory module 4200 may be provided as one semiconductor package by being packaged based on a Package on Package (PoP).

The network module 4300 may communicate with external devices. In an example, the network module 4300 may support wireless communications such as Code Division Multiple Access (CDMA), Global System for Mobile communication (GSM), Wideband CDMA (WCDMA), CDMA-2000, Time Division Multiple Access (TDMA), Long Term Evolution (LTE), Wimax, WLAN, UWB, Bluetooth, and Wi-Fi. In an example, the network module 4300 may be included in the application processor 4100.

The storage module 4400 may store data. For example, the storage module 4400 may store data received from the application processor 4100. Alternatively, the storage module 4400 may transmit data stored therein to the application processor 4100. In an example, the storage module 4400 may be implemented with a nonvolatile semiconductor memory device such as a Phase-change RAM (PRAM), a Magnetic RAM (MRAM), a Resistive RAM (RRAM), a NAND flash, a NOR flash, or a NAND flash having a three-dimensional structure. In an example, the storage module 4400 may be provided as a removable drive such as a memory card of the user system 4000 or an external drive.

For example, the storage module 4400 may include a plurality of nonvolatile memory devices, and the plurality of nonvolatile memory devices may operate identically to the memory device described with reference to FIGS. 2 to 5. The storage module 4400 may operate identically to the storage device 50 described with reference to FIG. 1.

The user interface 4500 may include interfaces for inputting data or commands to the application processor 4100 or outputting data to an external device. In an example, the user interface 4500 may include user input interfaces such as a keyboard, a keypad, a button, a touch panel, a touch screen, a touch pad, a touch ball, a camera, a microphone, a gyroscope sensor, a vibration sensor and a piezoelectric element. The user interface 4500 may include user output interfaces such as a Liquid Crystal Display (LCD), an Organic Light Emitting Diode (OLED) display device, an Active Matrix OLED (AMOLED) display device, an LED, a speaker, and a motor.

In accordance with embodiments of the present disclosure, there is provided a storage device having an improved data receiving rate and an operating method thereof.

In the above-described embodiments, steps may be selectively performed, combined with other steps, or in some cases omitted. Moreover, the steps are not necessarily performed in the described order; rather, steps may be rearranged. The embodiments disclosed herein are only examples to facilitate an understanding of the present disclosure, not to limit the present disclosure. Moreover, as those skilled in the art will understand in light of the present disclosure various modifications in form and details can be made within the scope of the present disclosure.

Although specific terminologies are used here, they are only to explain the embodiments of the present disclosure. Therefore, the present disclosure is not restricted to the above-described embodiments, as many variations are possible within the spirit and scope of the present disclosure. Accordingly, the present invention embraces all such modifications and variations to the extent they fall within the scope of the claims including their equivalents.

What is claimed is:

1. A storage device comprising:
   a memory die package configured to include a plurality of memory devices each including a plurality of select signal pads; and
   a memory controller configured to provide a plurality of select signals representing a selected memory device, among the plurality of memory devices, through the plurality of select signal pads,
   wherein some select signals, among the plurality of select signals, include stack information indicating a total number of the plurality of memory devices included in the memory die package, and
   wherein the plurality of memory devices receive a data signal from the memory controller and store the data signal by applying an amount of delay which is determined according to the total number of the plurality of memory devices included in the memory die package.

2. The storage device of claim 1, wherein the selected memory device includes:
   a plurality of memory blocks;
   a peripheral circuit configured to perform operations on a selected portion of the plurality of memory blocks; and
   a control logic configured to receive the plurality of select signals and to control the peripheral circuit, wherein the control logic includes:
- a delay tuning circuit configured to generate a delay tuning signal based on the stack information; and
- a data tuner configured to receive the data signal and to output a tuned data signal by applying the amount of delay to the data signal according to the delay tuning signal.

3. The storage device of claim 2, wherein the total number indicated by the stack information is any of eight, four, and two.

4. The storage device of claim 2, wherein the delay tuning circuit generates the delay tuning signal to reduce the amount of delay as the total number of the plurality of memory devices is increased.

5. The storage device of claim 1,
wherein the plurality of select signals include first to sixth select signals, and
wherein the first to third select signals, among the first to sixth select signals, respectively identify the plurality of memory devices.

6. The storage device of claim 5, wherein the fourth to sixth select signals, among the first to sixth select signals, include the stack information.

7. The storage device of claim 2, wherein the delay tuning circuit includes:
- an input signal generator configured to generate an internal control signal according to a delay tuning command provided by the memory controller and the some select signals;
- a delay tuning signal generator configured to generate different stack register signals according to different numbers of memory devices in response to the internal control signal; and
- a delay tuning signal output component configured to output the delay tuning signal based on the stack register signal and the delay tuning command.

8. A memory device comprising:
- a plurality of select signal pads configured to receive a plurality of select signals respectively;
- a plurality of data signal pads configured to receive a data signal;
- a delay tuning circuit in communication with the plurality of select signal pads and the plurality of data signal pads, the delay tuning circuit configured to determine an amount of delay to be applied to the data signal according to first select signals among the plurality of select signals; and
- a data storage configured to generate a tuned data signal by applying the determined amount of delay to the data signal, and to store the tuned data signal according to a reference clock,
wherein the first select signals represent a total number of a plurality of memory devices including the memory device,
wherein second select signals other than the first select signals among the plurality of select signals enable the memory device, and
wherein the plurality of memory devices receive the plurality of select signals in common.

9. The memory device of claim 8, further comprising an input driver configured to receive the data signal input through the plurality of data signal pads.

10. The memory device of claim 9, wherein the input driver generates an internal data signal having a high or low state based on a comparison of the data signal with a reference voltage.

11. The memory device of claim 10, wherein the delay tuning circuit generates a delay tuning signal for determining the amount of delay based on stack information represented by the first select signals.

12. The memory device of claim 11, wherein the stack information indicates the total number of the plurality of memory devices commonly coupled to the plurality of data signal pads.

13. The memory device of claim 12, wherein the delay tuning circuit generates the delay tuning signal to reduce the amount of the delay as the total number of the plurality of memory devices commonly coupled to the plurality of data signal pads is increased.

14. The memory device of claim 13, further comprising a data tuner configured to delay the internal data signal in response to the delay tuning signal.

15. A method for operating a memory device including a plurality of select signal pads and a plurality of data signal pads, the method comprising:
- receiving a delay tuning command from a memory controller;
- acquiring stack information from first select signals, among a plurality of select signals input through the plurality of select signal pads, in response to the delay tuning command; and
- generating a delay tuning signal for determining an amount of delay, to be applied to a data signal input through the plurality of data signal pads, based on the stack information,
wherein the first select signals represent a total number of a plurality of memory devices including the memory device,
wherein second select signals other than the first select signals among the plurality of select signals enables the memory device, and
wherein the plurality of memory devices receive the plurality of select signals in common.

16. The method of claim 15, wherein the stack information indicates the total number of the plurality of memory devices commonly coupled to the plurality of data signal pads.

17. The method of claim 16, wherein the generating the delay tuning signal comprises generating the delay tuning signal to reduce the amount of the delay as the total number of the plurality of memory devices commonly coupled to the plurality of data signal pads is increased.

18. The method of claim 15,
wherein the plurality of select signals include first to sixth select signals, and
wherein the first to third select signals, among the first to sixth select signals, respectively identify the plurality of memory devices.

19. The method of claim 18, wherein the fourth to sixth select signals, among the first to sixth select signals, include the stack information.

20. The method of claim 15, further comprising delaying the data signal by the determined amount of delay and storing the delayed data signal.

* * * * *